US011787688B2

(12) United States Patent
Lee et al.

(10) Patent No.: US 11,787,688 B2
(45) Date of Patent: Oct. 17, 2023

(54) METHODS OF FORMING MEMS DIAPHRAGMS INCLUDING CORRUGATIONS

(71) Applicant: KNOWLES ELECTRONICS, LLC, Itasca, IL (US)

(72) Inventors: Sung Bok Lee, Itasca, IL (US); Vahid Naderyan, Itasca, IL (US); Bing Yu, Itasca, IL (US); Michael Kuntzman, Itasca, IL (US); Yunfei Ma, Itasca, IL (US); Michael Pedersen, Itasca, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 163 days.

(21) Appl. No.: 17/099,442

(22) Filed: Nov. 16, 2020

(65) Prior Publication Data

US 2021/0070610 A1 Mar. 11, 2021

Related U.S. Application Data

(63) Continuation of application No. 16/593,498, filed on Oct. 4, 2019, now Pat. No. 10,870,577.
(Continued)

(51) Int. Cl.
*B81C 1/00* (2006.01)
*B81B 3/00* (2006.01)
(Continued)

(52) U.S. Cl.
CPC ........ *B81C 1/00158* (2013.01); *B81B 3/0021* (2013.01); *G01L 9/0042* (2013.01);
(Continued)

(58) Field of Classification Search
CPC .. H04R 19/04; H04R 7/04; H04R 7/18; B81C 1/00158; B81B 3/0021; B81B 2203/0127; B81B 2201/0257
See application file for complete search history.

(56) References Cited

U.S. PATENT DOCUMENTS

| 4,154,115 A | 5/1979 | Hartung et al. |
| 4,435,986 A | 3/1984 | Choffat |

(Continued)

FOREIGN PATENT DOCUMENTS

| CN | 103344377 A | 10/2013 |
| CN | 103716743 A | 4/2014 |

(Continued)

OTHER PUBLICATIONS

Chuang et al., "Mechanical Property Characterization of LPCVD Silicon Nitride Thin Films at Cryogenic Temperatures," Journal of Microelectromechanical Systems, vol. 13, No. 5, 10 pages (Oct. 2004).
(Continued)

*Primary Examiner* — Jaehwan Oh
*Assistant Examiner* — John M Parker
(74) *Attorney, Agent, or Firm* — FOLEY & LARDNER LLP

(57) ABSTRACT

A method of forming an acoustic transducer comprises providing a substrate and depositing a first structural layer on the substrate. The first structural layer is selectively etched to form at least one of an enclosed trench or an enclosed pillar thereon. A second structural layer is deposited on the first structural layer and includes a depression or a bump corresponding to the enclosed trench or pillar, respectively. At least the second structural layer is heated to a temperature above a glass transition temperature of the second structural layer causing the second structural layer to
(Continued)

reflow. A diaphragm layer is deposited on the second structural layer such that the diaphragm layer includes at least one of a downward facing corrugation corresponding to the depression or an upward facing corrugation corresponding to the bump. The diaphragm layer is released, thereby forming a diaphragm suspended over the substrate.

15 Claims, 30 Drawing Sheets

Related U.S. Application Data

(60) Provisional application No. 62/742,164, filed on Oct. 5, 2018.

(51) Int. Cl.
    *H04R 31/00* (2006.01)
    *G01L 9/00* (2006.01)

(52) U.S. Cl.
    CPC .... *H04R 31/003* (2013.01); *B81B 2201/0257* (2013.01); *B81B 2201/0264* (2013.01); *B81B 2203/0127* (2013.01); *B81C 2201/0132* (2013.01); *B81C 2201/0133* (2013.01)

(56) References Cited

U.S. PATENT DOCUMENTS

| | | |
|---|---|---|
| 5,767,612 A | 6/1998 | Takeuchi et al. |
| 5,888,412 A | 3/1999 | Sooriakumar et al. |
| 6,075,867 A | 6/2000 | Bay et al. |
| 6,431,003 B1 | 8/2002 | Stark et al. |
| 6,435,033 B2 | 8/2002 | Delaye |
| 6,535,460 B2 | 3/2003 | Loeppert et al. |
| 6,571,445 B2 | 6/2003 | Ladabaum |
| 6,662,663 B2 | 12/2003 | Chen |
| 6,675,931 B2 | 1/2004 | Sahyoun |
| 6,859,542 B2 | 2/2005 | Johannsen et al. |
| 7,030,407 B2 | 4/2006 | Michler |
| 7,040,173 B2 | 5/2006 | Dehe |
| 7,124,638 B2 | 10/2006 | Kandler |
| 7,150,195 B2 | 12/2006 | Jacobsen et al. |
| 7,190,038 B2 | 3/2007 | Dehe et al. |
| 7,470,546 B2 | 12/2008 | Lehmann |
| 7,473,572 B2 | 1/2009 | Dehe et al. |
| 7,489,593 B2 | 2/2009 | Nguyen-Dinh et al. |
| 7,535,156 B2 | 5/2009 | Terje et al. |
| 7,545,012 B2 | 6/2009 | Smith et al. |
| 7,781,249 B2 | 8/2010 | Laming et al. |
| 7,793,550 B2 | 9/2010 | Elian et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 7,918,135 B2 | 4/2011 | Hammerschmidt |
| 8,127,619 B2 | 3/2012 | Hammerschmidt |
| 8,339,764 B2 | 12/2012 | Steeneken et al. |
| 8,447,057 B2 | 5/2013 | Goida et al. |
| 8,461,655 B2 | 6/2013 | Klein et al. |
| 8,575,037 B2 | 11/2013 | Friza et al. |
| 8,650,963 B2 | 2/2014 | Barr et al. |
| 8,723,277 B2 | 5/2014 | Dehe et al. |
| 8,809,973 B2 | 8/2014 | Theuss |
| 8,989,411 B2 | 3/2015 | Hall et al. |
| 9,031,266 B2 | 5/2015 | Dehe et al. |
| 9,179,221 B2 | 11/2015 | Barzen et al. |
| 9,181,080 B2 | 11/2015 | Dehe et al. |
| 9,237,402 B2 | 1/2016 | Loeppert |
| 9,290,379 B2 | 3/2016 | Theuss |
| 9,321,630 B2 | 4/2016 | Xu et al. |
| 9,332,330 B2 | 5/2016 | Elian et al. |
| 9,363,609 B2 | 6/2016 | Friza et al. |
| 9,380,381 B2 | 6/2016 | Staeussnigg |
| 9,383,282 B2 | 7/2016 | Besling et al. |
| 9,383,285 B2 | 7/2016 | Phan Le et al. |
| 9,409,763 B2 | 8/2016 | Dehe et al. |
| 9,425,757 B2 | 8/2016 | Straeussnigg et al. |
| 9,432,759 B2 | 8/2016 | Elian et al. |
| 9,438,979 B2 | 9/2016 | Dehe |
| 9,503,814 B2 | 11/2016 | Schultz et al. |
| 9,510,107 B2 | 11/2016 | Dehe et al. |
| 9,516,428 B2 | 12/2016 | Dehe et al. |
| 9,549,263 B2 | 1/2017 | Uchida |
| 9,550,211 B2 | 1/2017 | Dirksen et al. |
| 9,609,429 B2 | 3/2017 | Reining |
| 9,631,996 B2 | 4/2017 | Wiesbauer et al. |
| 9,641,137 B2 | 5/2017 | Duenser et al. |
| 9,689,770 B2 | 6/2017 | Hammerschmidt |
| 9,828,237 B2 | 11/2017 | Walther et al. |
| 9,884,757 B2 | 2/2018 | Winkler et al. |
| 9,903,779 B2 | 2/2018 | Hammerschmidt |
| 9,942,677 B2 | 4/2018 | Wiesbauer et al. |
| 9,945,746 B2 | 4/2018 | Wiesbauer et al. |
| 9,986,344 B2 | 5/2018 | Dehe et al. |
| 9,998,812 B2 | 6/2018 | Elian et al. |
| 10,129,676 B2 | 11/2018 | Walther et al. |
| 10,153,740 B2 | 12/2018 | Albers et al. |
| 10,189,699 B2 | 1/2019 | Walther et al. |
| 10,200,801 B2 | 2/2019 | Wiesbauer et al. |
| 10,231,061 B2 | 3/2019 | Dehe et al. |
| 10,322,481 B2 | 6/2019 | Dehe et al. |
| 10,362,408 B2 | 7/2019 | Kuntzman et al. |
| 10,405,106 B2 | 9/2019 | Lee |
| 10,433,070 B2 | 10/2019 | Dehe et al. |
| 10,560,771 B2 | 2/2020 | Dehe et al. |
| 10,575,101 B2 | 2/2020 | Walther et al. |
| 10,582,306 B2 | 3/2020 | Dehe |
| 10,589,990 B2 | 3/2020 | Dehe et al. |
| 10,641,626 B2 | 5/2020 | Bretthauer et al. |
| 10,648,999 B2 | 5/2020 | Meinhold |
| 10,669,151 B2 | 6/2020 | Strasser et al. |
| 10,676,346 B2 | 6/2020 | Walther et al. |
| 10,689,250 B2 | 6/2020 | Fueldner et al. |
| 10,715,926 B2 | 7/2020 | Bretthauer et al. |
| 10,939,214 B2 | 3/2021 | Kuntzman et al. |
| 2002/0053242 A1 | 5/2002 | Tai et al. |
| 2002/0063242 A1 | 5/2002 | Hayashi et al. |
| 2005/0177045 A1 | 8/2005 | Degertekin et al. |
| 2005/0207605 A1 | 9/2005 | Dehe et al. |
| 2005/0219953 A1 | 10/2005 | Bayram et al. |
| 2007/0205492 A1 | 9/2007 | Wang |
| 2007/0278501 A1 | 12/2007 | Macpherson et al. |
| 2008/0175425 A1 | 7/2008 | Roberts et al. |
| 2008/0247572 A1 | 10/2008 | Langereis et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2008/0292888 A1 | 11/2008 | Hucker et al. |
| 2009/0001553 A1 | 1/2009 | Pahl et al. |
| 2009/0041291 A1 | 2/2009 | Toyofuku et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0158279 A1* | 6/2010 | Conti .................. H04R 19/005 381/174 |
| 2010/0170346 A1 | 7/2010 | Opitz et al. |
| 2010/0173437 A1 | 7/2010 | Wygant et al. |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2013/0001550 A1 | 1/2013 | Seeger et al. |
| 2013/0075836 A1 | 3/2013 | Lee |
| 2013/0108084 A1 | 5/2013 | Zhang |
| 2014/0071642 A1 | 3/2014 | Theuss |
| 2014/0264657 A1 | 9/2014 | Gogoi |
| 2014/0299948 A1 | 10/2014 | Wang et al. |

(56) References Cited

U.S. PATENT DOCUMENTS

| | | |
|---|---|---|
| 2015/0001647 A1 | 1/2015 | Dehe et al. |
| 2015/0090043 A1 | 4/2015 | Ruhl et al. |
| 2015/0110291 A1 | 4/2015 | Furst et al. |
| 2015/0230027 A1 | 8/2015 | Inoue et al. |
| 2015/0247879 A1 | 9/2015 | Meinhold |
| 2015/0296307 A1 | 10/2015 | Shao et al. |
| 2016/0066099 A1 | 3/2016 | Dehe et al. |
| 2016/0096726 A1 | 4/2016 | Dehe et al. |
| 2018/0035229 A1 | 2/2018 | Deas et al. |
| 2018/0063634 A1 | 3/2018 | Dave et al. |
| 2018/0070162 A1 | 3/2018 | Lim et al. |
| 2018/0091906 A1 | 3/2018 | Khenkin et al. |
| 2018/0198185 A1 | 7/2018 | Zeng et al. |
| 2018/0234774 A1 | 8/2018 | Walther et al. |
| 2018/0317022 A1 | 11/2018 | Evans et al. |
| 2019/0052976 A1* | 2/2019 | Sun .......................... H04R 7/04 |
| 2019/0082270 A1* | 3/2019 | Sun .......................... H04R 7/18 |
| 2019/0082271 A1* | 3/2019 | Kim ...................... H04R 19/005 |
| 2019/0112182 A1 | 4/2019 | Metzger-Brueckl et al. |
| 2019/0181776 A1 | 6/2019 | Tumpold et al. |
| 2019/0246459 A1 | 8/2019 | Tumpold et al. |
| 2019/0255669 A1 | 8/2019 | Dehe et al. |
| 2019/0270639 A1 | 9/2019 | Lorenz et al. |
| 2019/0331531 A1 | 10/2019 | Glacer et al. |
| 2019/0339193 A1 | 11/2019 | Eberl et al. |
| 2019/0352175 A1 | 11/2019 | Tumpold et al. |
| 2019/0363757 A1 | 11/2019 | Mikolajczak et al. |
| 2020/0057031 A1 | 2/2020 | Theuss et al. |
| 2020/0112799 A1 | 4/2020 | Kuntzman et al. |
| 2020/0137501 A1* | 4/2020 | Piechocinski .......... H04R 1/086 |
| 2020/0204925 A1 | 6/2020 | Zou et al. |
| 2020/0216309 A1 | 7/2020 | Fueldner et al. |
| 2020/0239302 A1 | 7/2020 | Strasser et al. |
| 2020/0252728 A1 | 8/2020 | Niederberger |
| 2020/0252729 A1 | 8/2020 | Mueller et al. |

FOREIGN PATENT DOCUMENTS

| | | |
|---|---|---|
| CN | 107465983 A | 12/2017 |
| CN | 207072807 U | 3/2018 |
| CN | 107872760 A | 4/2018 |
| CN | 108449702 A | 8/2018 |
| DE | 28 24 832 B1 | 8/2018 |
| EP | 2 005 789 A1 | 12/2008 |
| KR | 10-0571967 B1 | 4/2006 |
| TW | 201613372 A | 4/2001 |
| WO | WO-2012/085335 A1 | 6/2012 |
| WO | WO-2017/105851 A1 | 6/2017 |
| WO | WO-2018/096130 A1 | 5/2018 |
| WO | PCT/US2019/054695 | 10/2019 |

OTHER PUBLICATIONS

Hohm, Dietmar; Hess, Gisela: "A subminiature condenser microphone with silicon nitride membrane and silicone back plate" The Journal of the Acoustical Society of America 85, 476 (1989); doi: 10.1121/1.397699.

International Search Report and Written Opinion, PCT/US2019/054726, Knowles Electronics, LLC (dated Feb. 13, 2020).

International Search Report and Written Opinion, PCT/US2019/054752, Knowles Electronics, LLC (dated Jan. 23, 2020).

U.S. Appl. No. 17/111,465, filed Dec. 3, 2020, Loeppert et al.

U.S. Appl. No. 17/127,794, filed Dec. 18, 2020, Chandrasekaran et al.

U.S. Appl. No. 17/133,506, filed Dec. 23, 2020, Loeppert et al.

U.S. Appl. No. 17/137,678, filed Dec. 30, 2020, Guo.

U.S. Appl. No. 17/159,983, filed Jan. 27, 2021, Lee et al.

U.S. Appl. No. 61/810,387, filed Apr. 10, 2013, Schultz et al.

Andrews et al., "A comparison of squeeze-film theory with measurements on a microstructure," Industrial Research Ltd., Mar. 24, 1992, 9 pages.

Bay et al., "Design of a silicon microphone with differential read-out of a sealed double parallel-plate capacitor," Sensors and Actuators A 53 (1996), pp. 232-236, 5 pages.

First Office Action on CN Appl. Ser. No. 20198005534.3 dated Dec. 2, 2021 (28 pages).

Hansen et al., "Wideband micromachined capacitive microphones with radio frequency detection," Edward L. Ginzton Laboratory, Stanford University, Stanford, California, May 21, 2004, pp. 828-842, 15 pages.

International Preliminary Report on Patentability on PCT Appl. Ser. No. PCT/US2019/054695 dated Apr. 15, 2021 (6 pages).

International Search Report and Written Opinion on PCT Appl. Ser. No. PCT/US2019/054695 dated Jan. 23, 2020 (11 pages).

Lin, Der-Song, "Interface Engineering of Capacitive Micromachined Ultrasonic Transducers For Medical Applications," A Dissertation Submitted to the Department of Mechanical Engineering and the Committee on Graduate Studies of Stanford University in Partial Fulfillment of the Requirements for the Degree of Doctor of Philosophy, Jun. 2011, 168 pages.

Park et al., "Fabrication of Capacitive Micromachined Ultrasonic Transducers via Local Oxidation and Direct Water Bonding," Journal of Microelectromechanical Systems, vol. 20, No. 1, Feb. 2011, 10 pages.

Unknown, "Smart Sensors for Industrial Applications," Figure 19.1, p. 306, 1 page (2013).

Wygant et al., "50 kHz Capacitive Micromachined Ultrasonic Transducers for Generation of Highly Directional Sound with Parametric Arrays," IEEE Transactions on Ultrasonics, Ferroelectrics, and Frequency Control, vol. 56, No. 1, Jan. 2009, pp. 193-203, 11 pages.

* cited by examiner

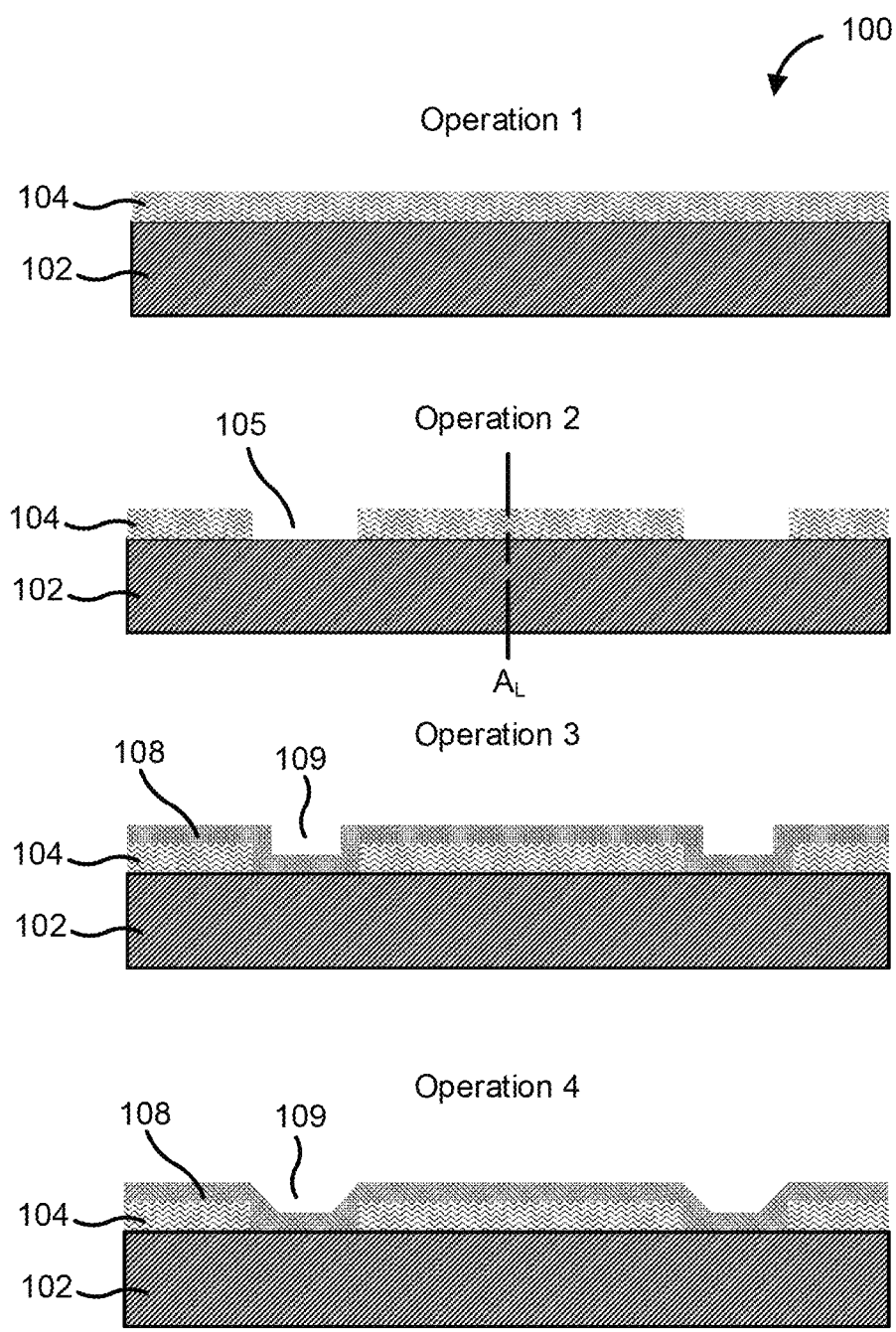

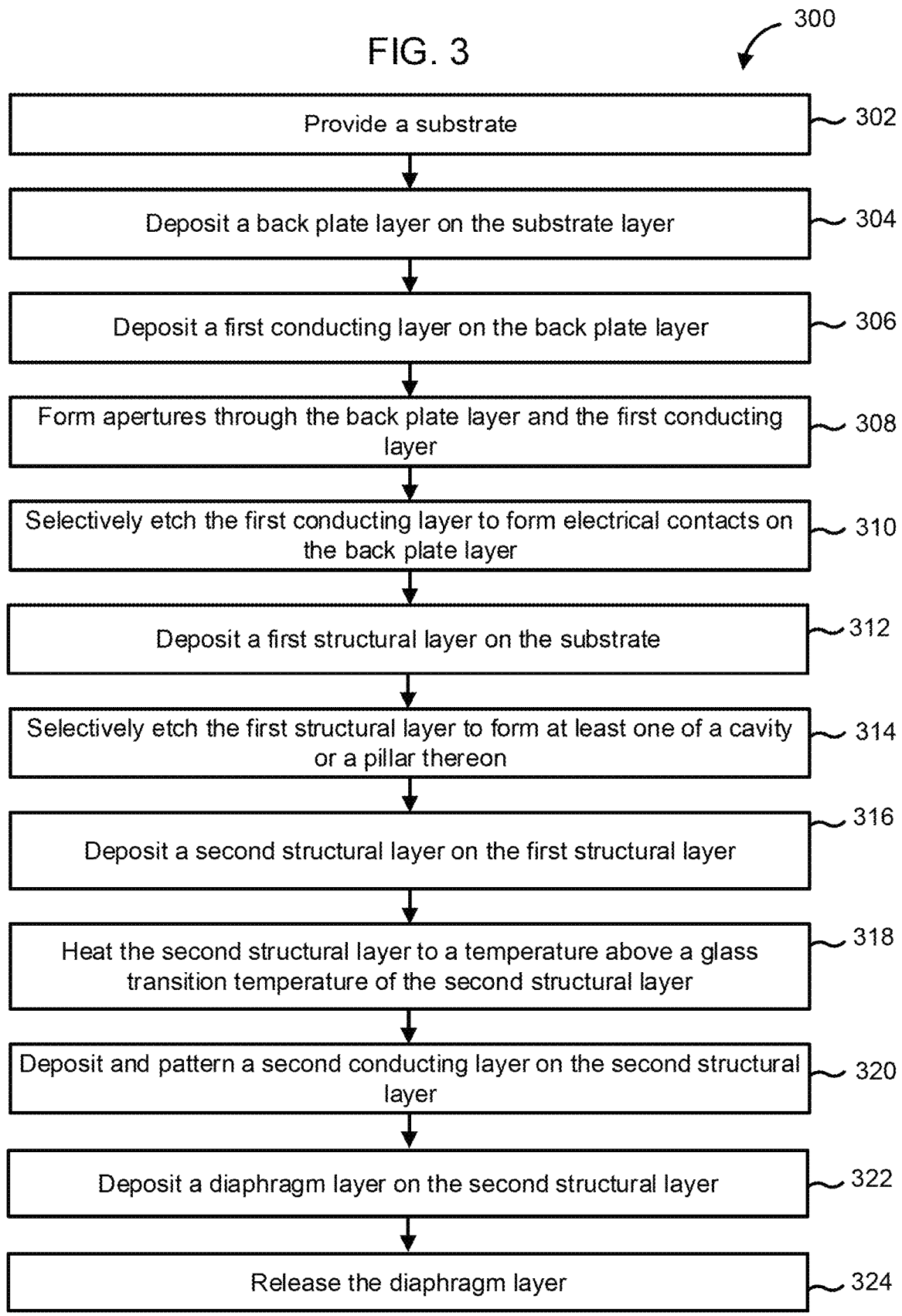

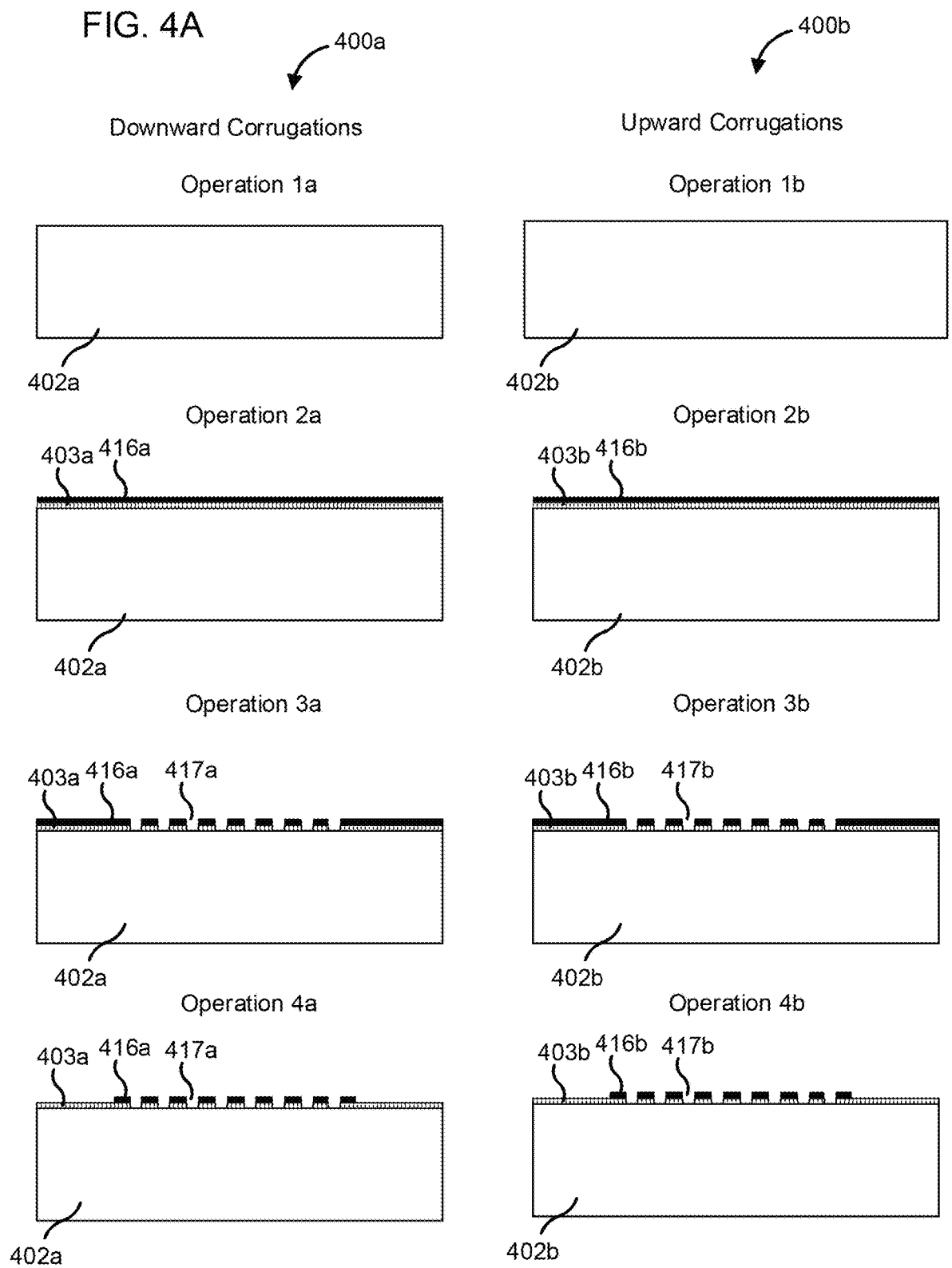

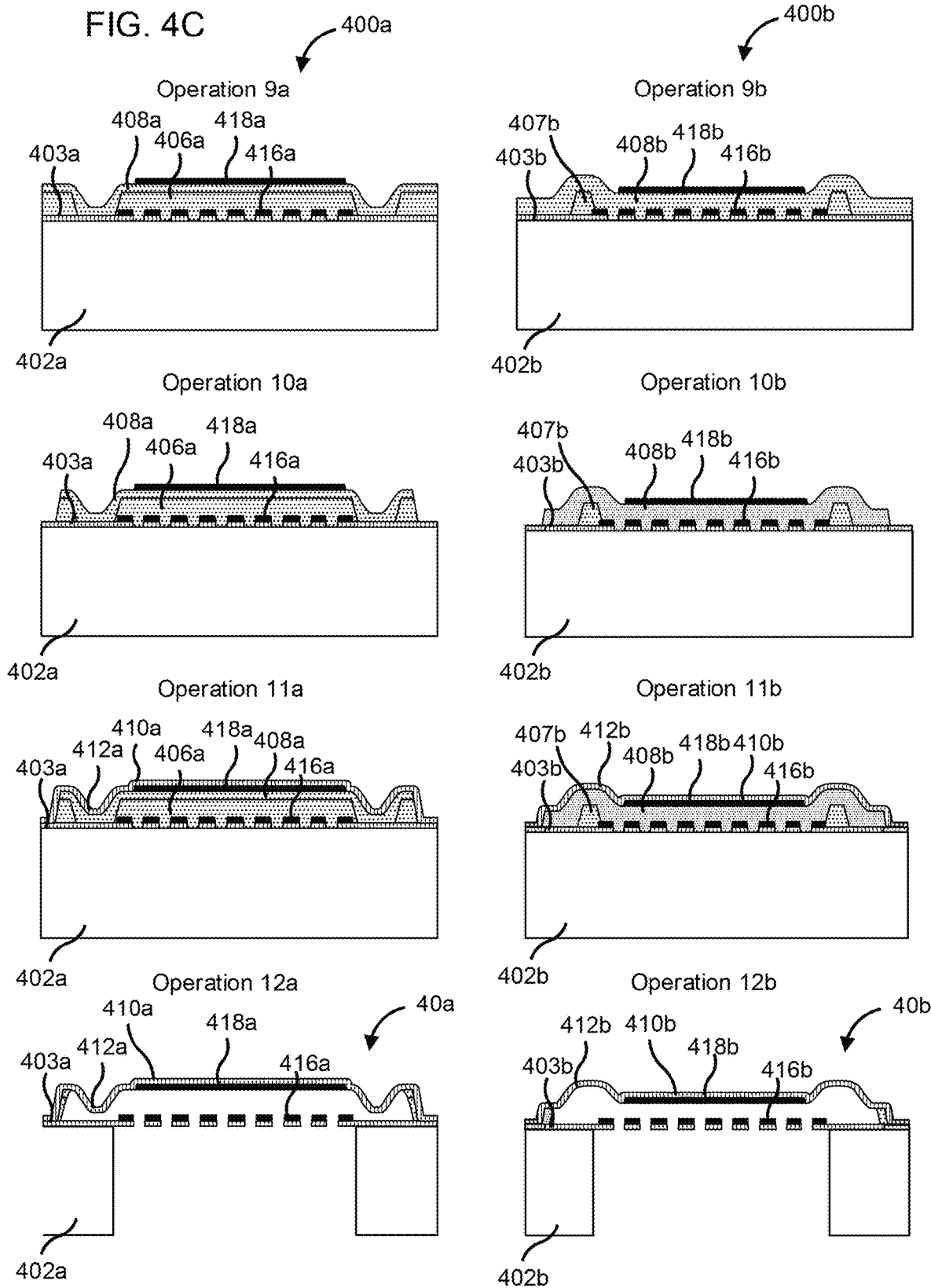

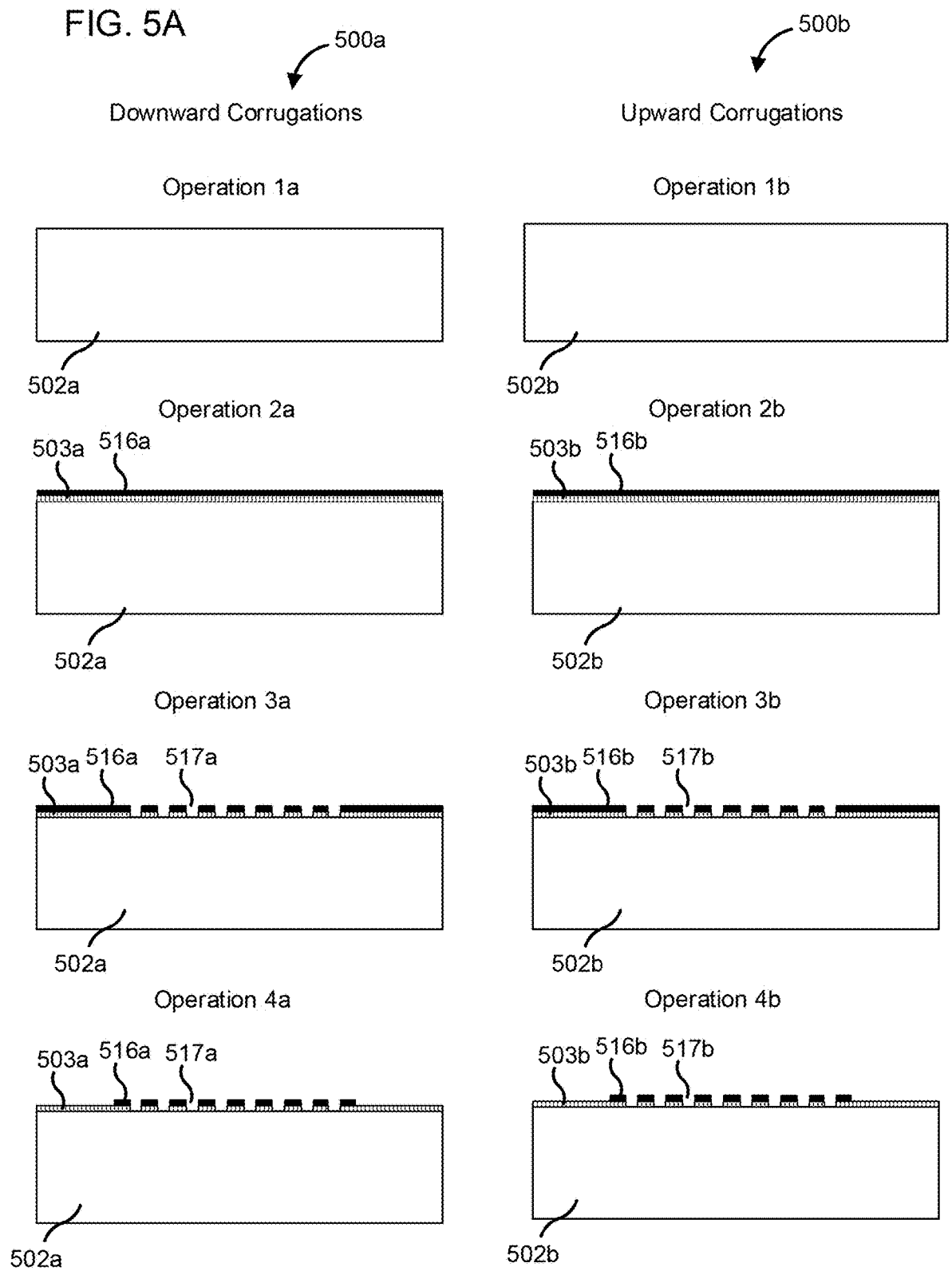

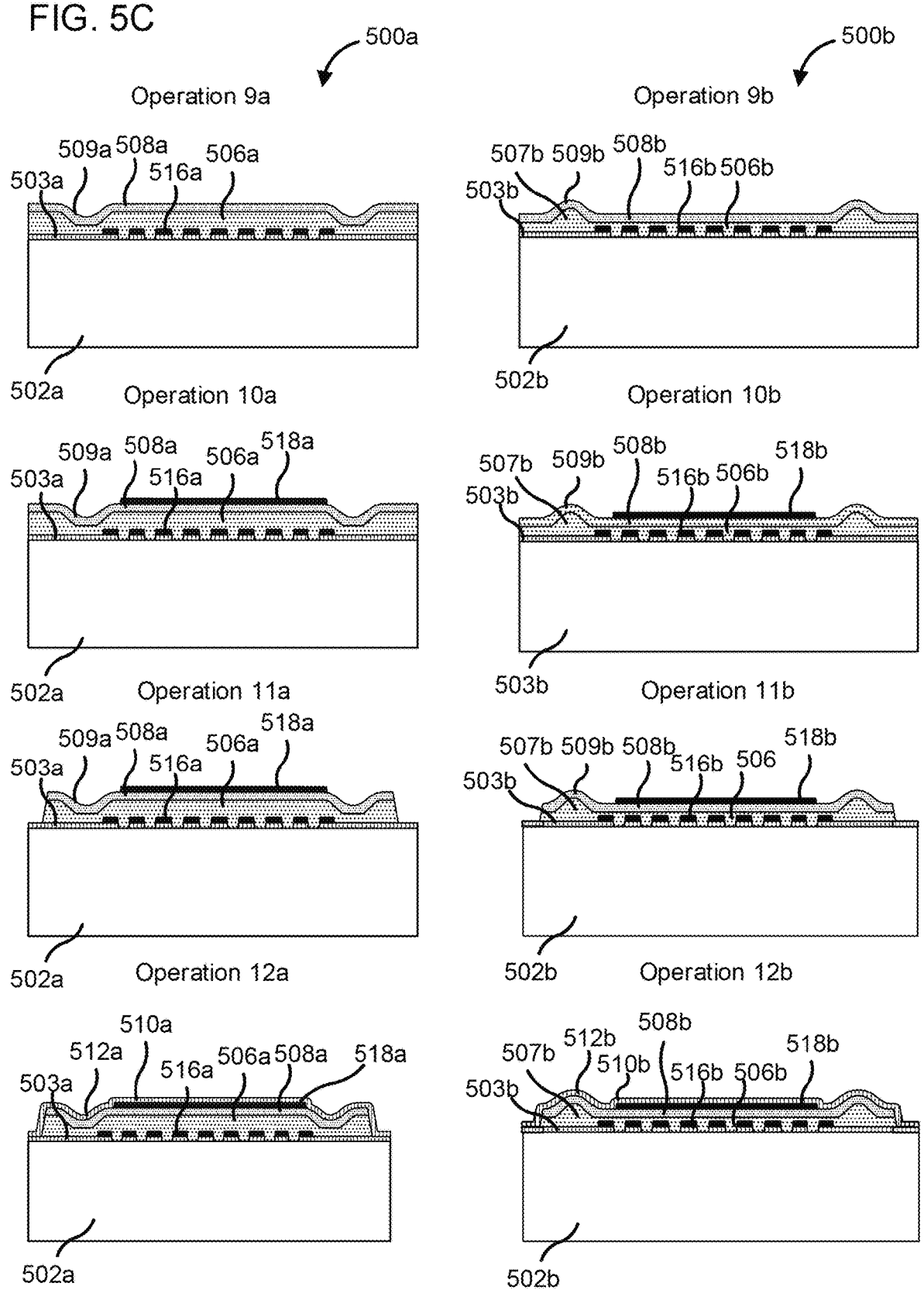

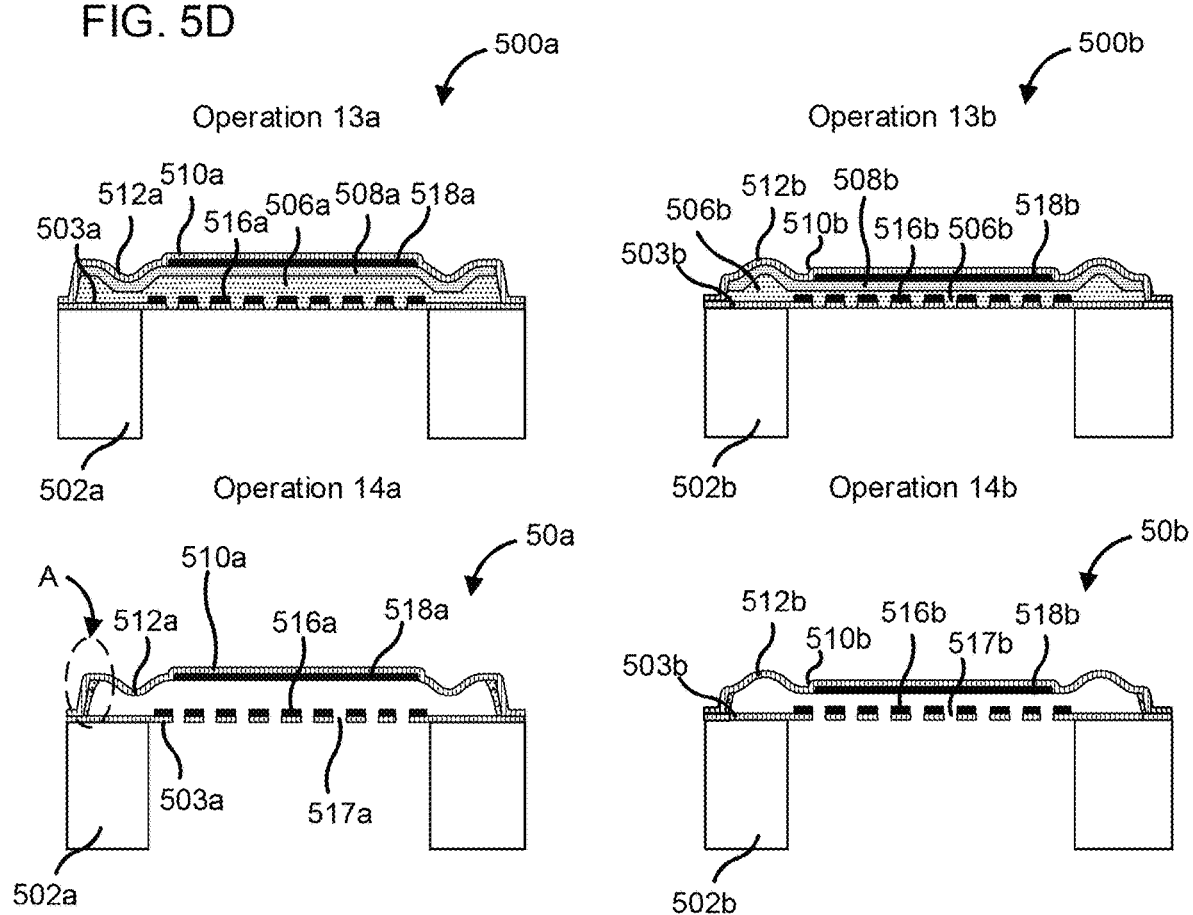
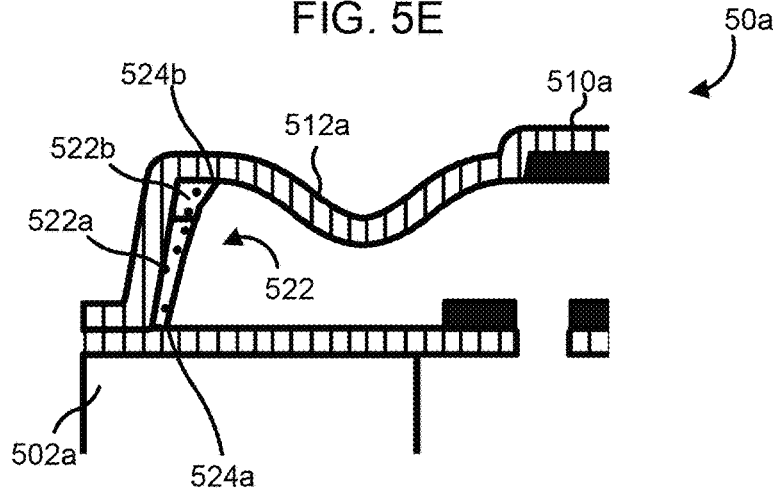

A

| Lot | Wafer | Corrugation Type/Etch | Smoothness | Failing Pressure (psi) |
|---|---|---|---|---|
| A | 24 | Down/Dry | Sharp | 9 |
| B | 5 | Down/Wet | Smooth | 18 |
| B | 15 | Down/Wet | Smooth | 34 |
| C | 25 | Down/Dry with PSG left | Smoothest | 60 |

B  Lot A Wafer 24   C  Lot B Wafer 5   D  Lot C Wafer 15   E  Lot C Wafer 25

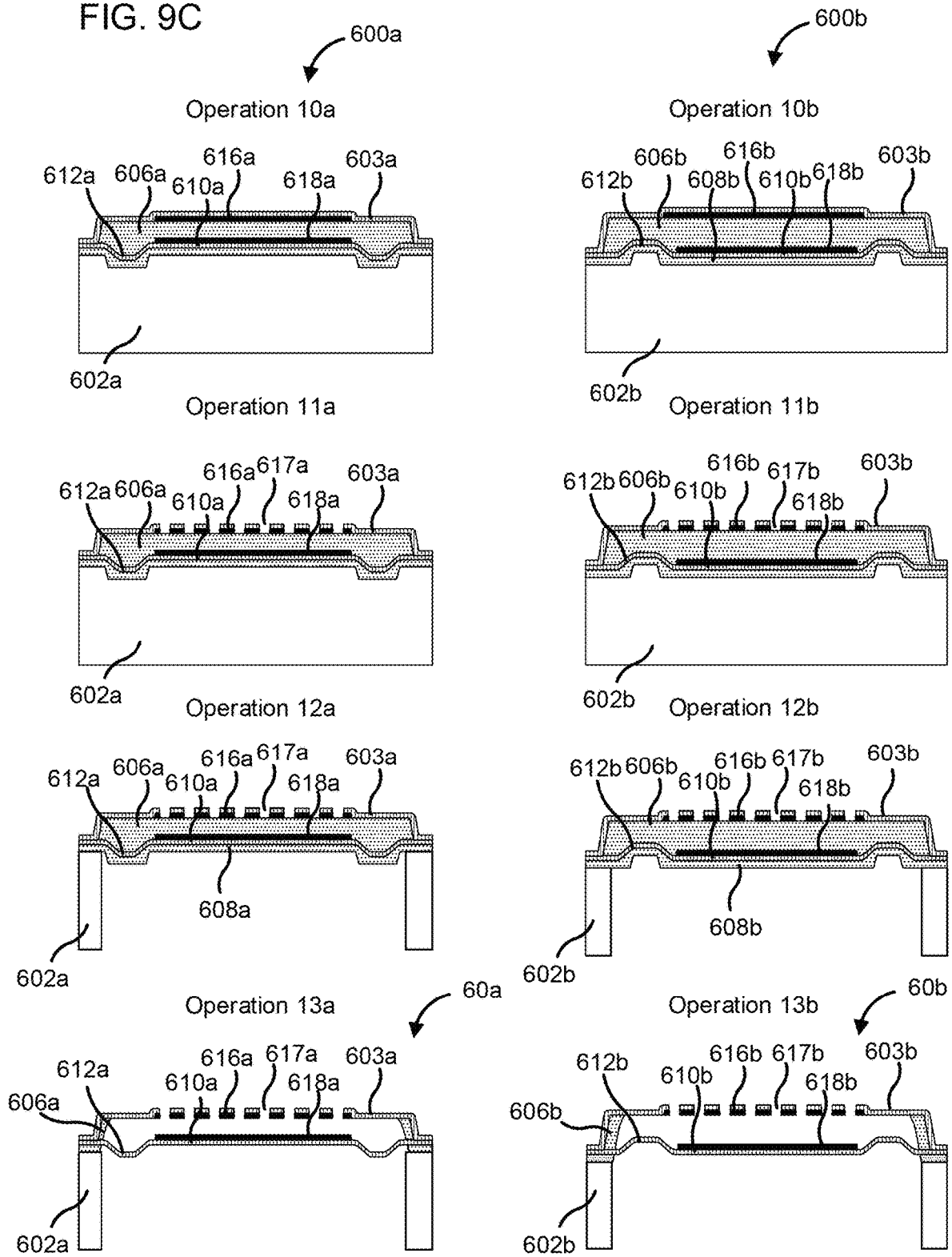

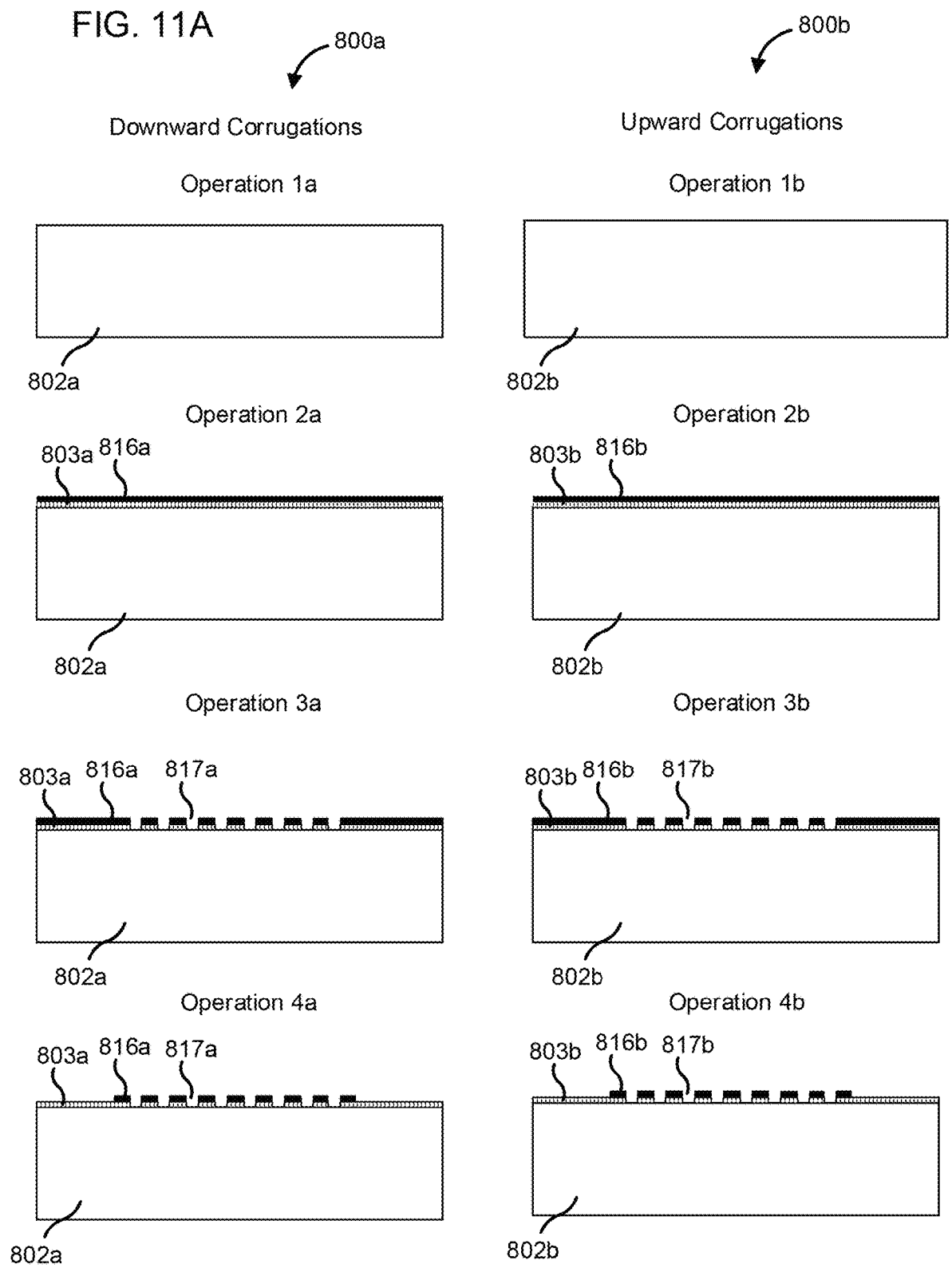

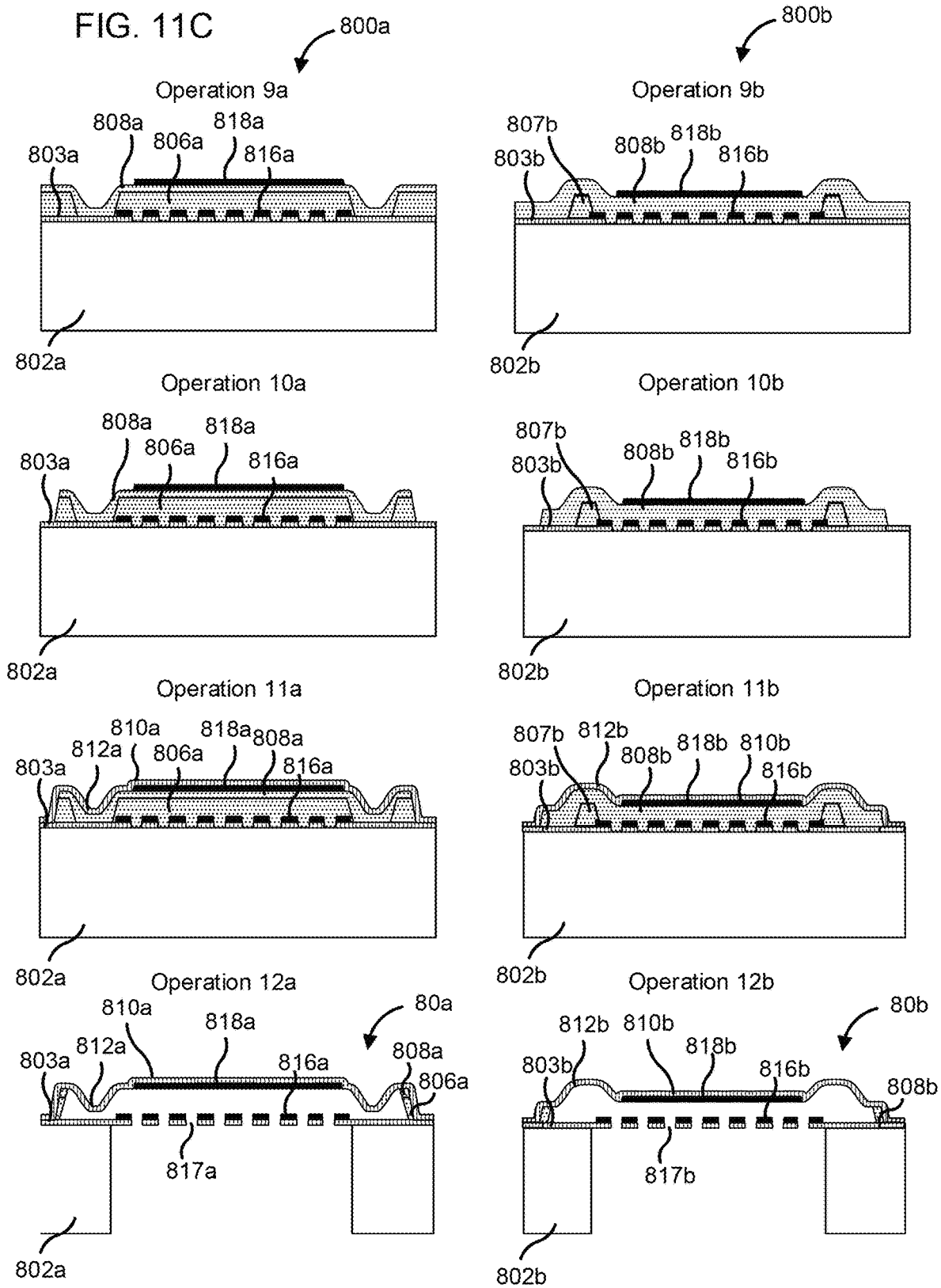

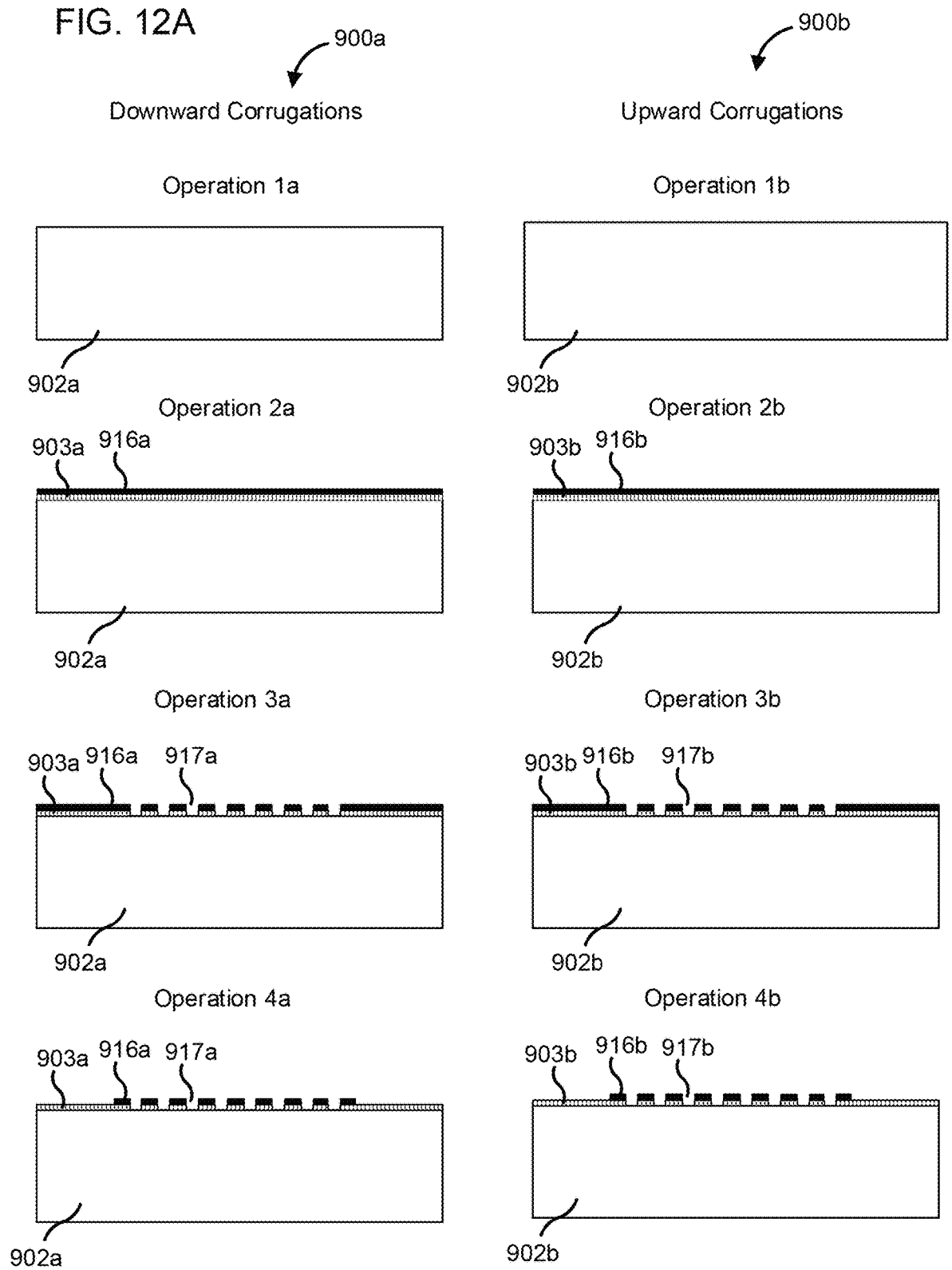

FIG. 13A
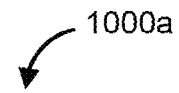
Operation 1
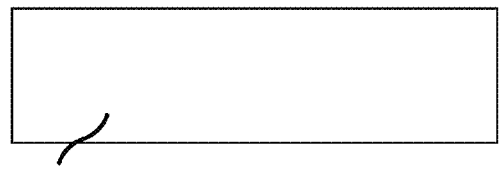
Operation 2
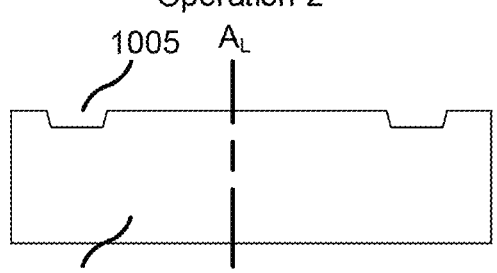
Operation 3
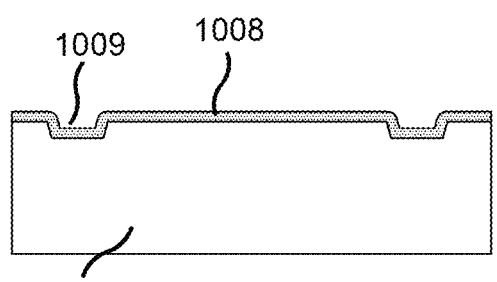
Operation 4
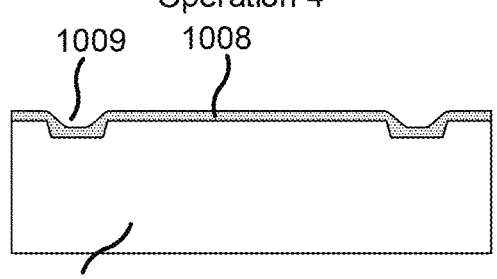
Operation 5
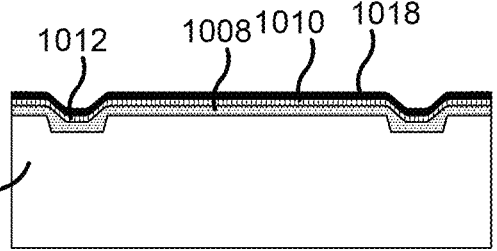

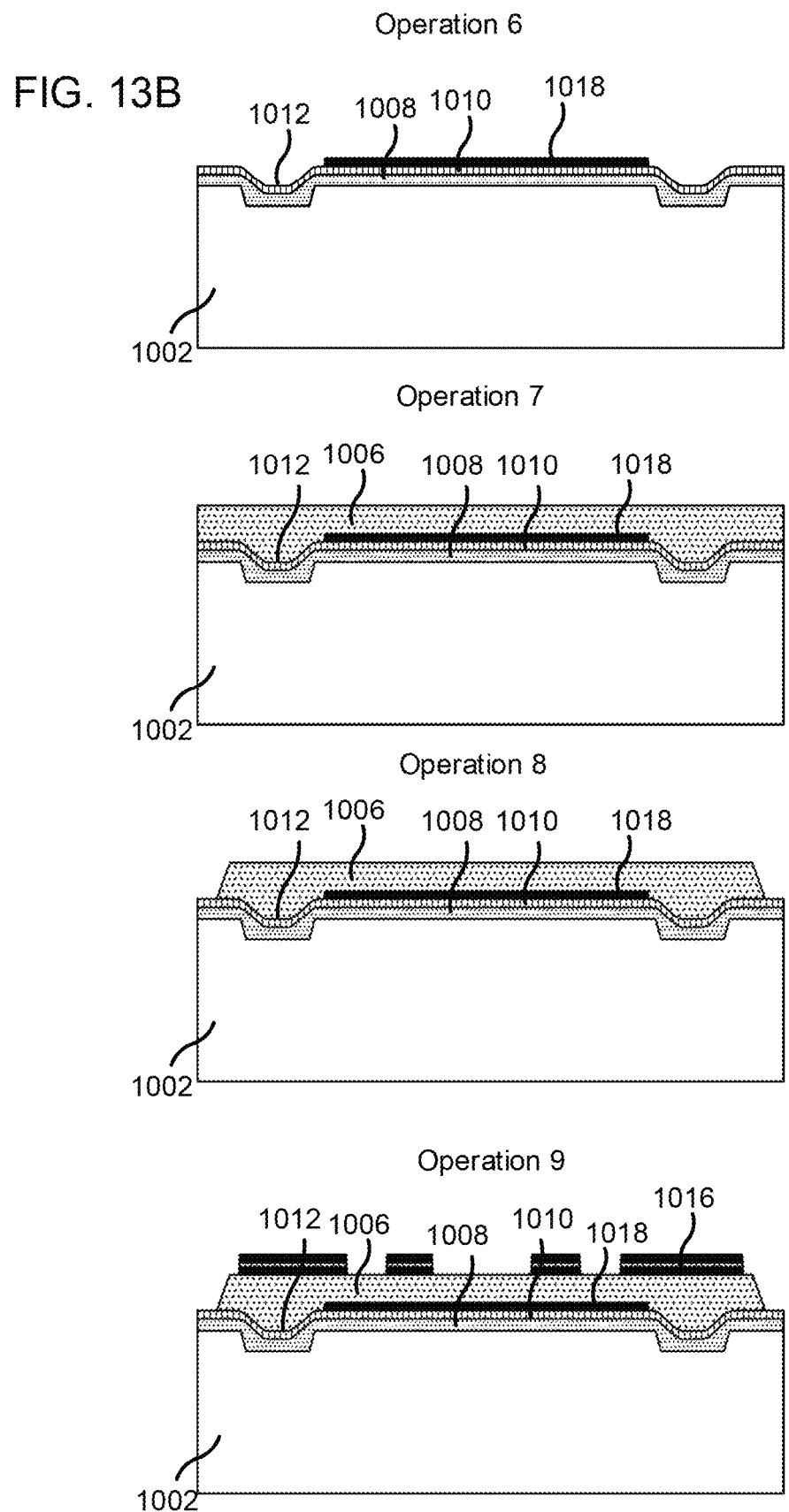

FIG. 13D
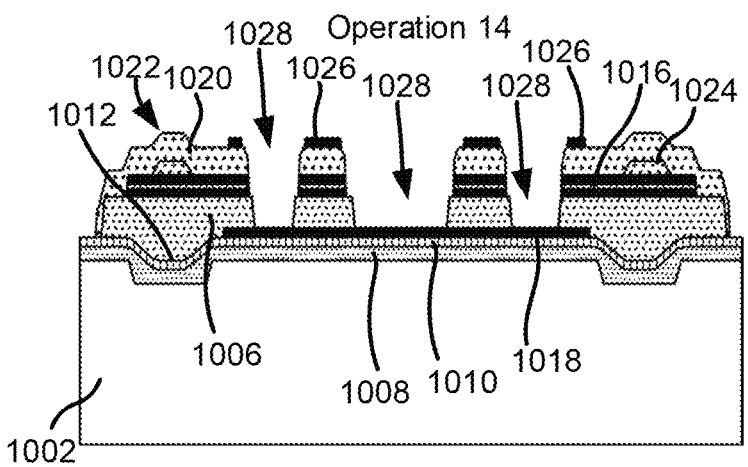
Operation 14
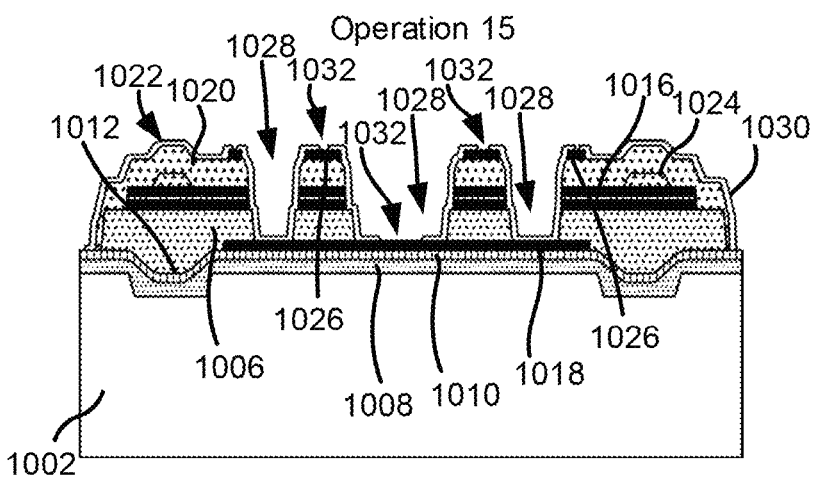
Operation 15
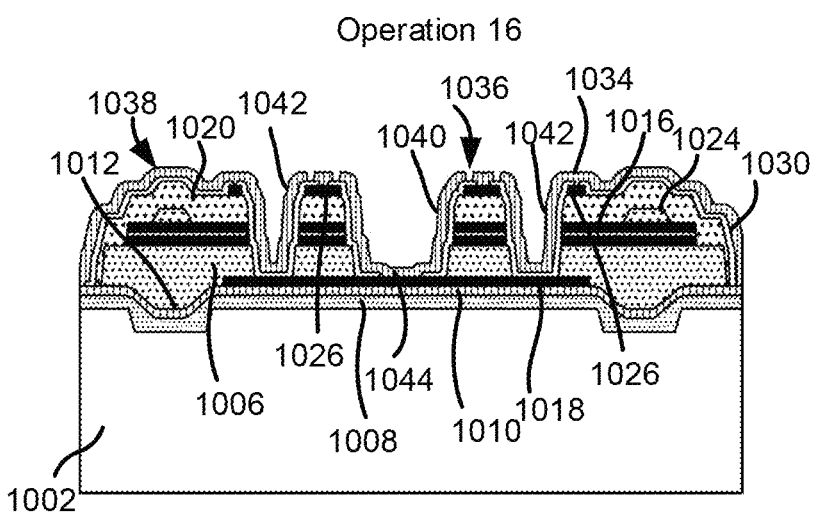
Operation 16

FIG. 13E
Operation 17
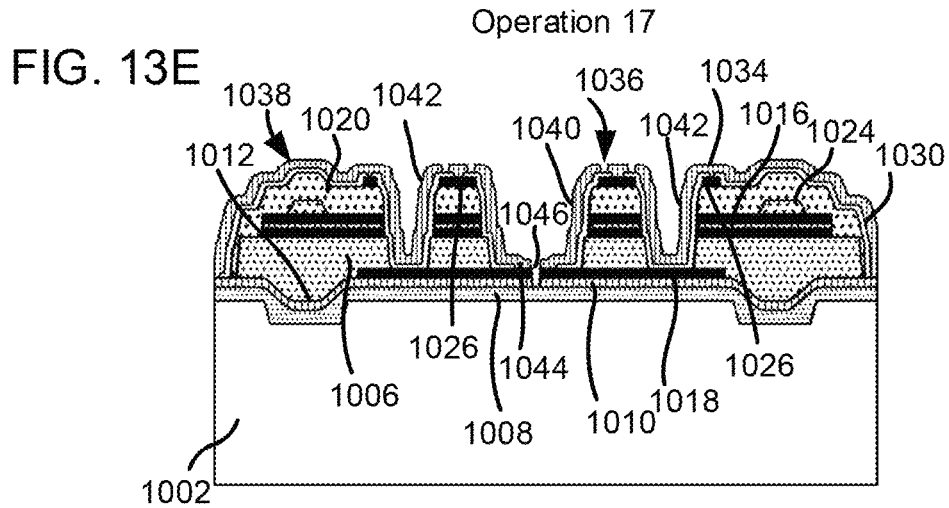
Operation 18
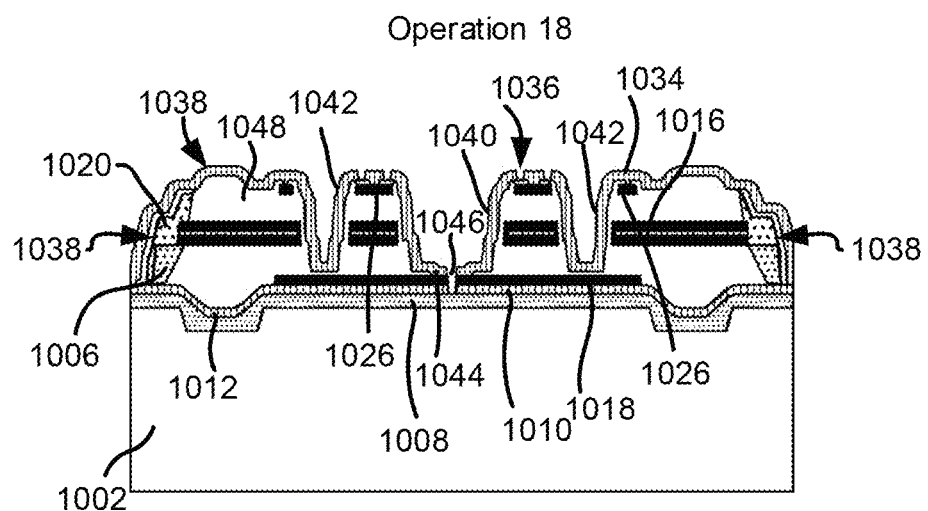
Operation 19
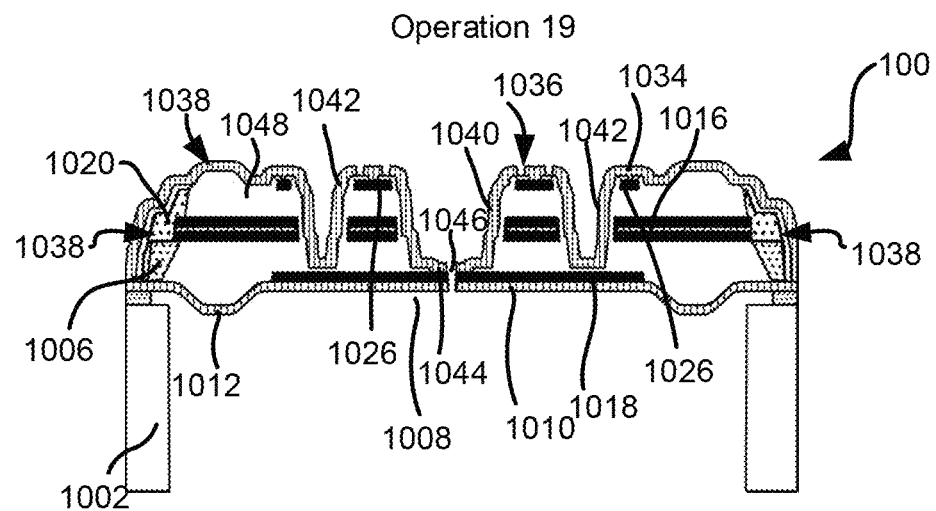

METHODS OF FORMING MEMS DIAPHRAGMS INCLUDING CORRUGATIONS

CROSS REFERENCE TO RELATED APPLICATIONS

The present application is a Continuation Application of U.S. application Ser. No. 16/593,498, filed Oct. 4, 2019, which claims priority to U.S. Provisional Application No. 62/742,164 filed Oct. 5, 2018, entitled "METHODS OF FORMING MEMS DIAPHRAGMS INCLUDING COR-RUGATIONS," the entire disclosures of which are incorporated herein by reference in their entirety.

TECHNICAL FIELD

The present disclosure relates generally to systems and methods of improving compliance of diaphragms included acoustic transducers.

BACKGROUND

Microphone assemblies are generally used in electronic devices to convert acoustic energy to electrical signals. Microphones generally include diaphragms for converting acoustic signals to electrical signals. Pressure sensors may also include such diaphragms. Advancements in micro and nanofabrication technologies have led to the development of progressively smaller micro-electro-mechanical-system (MEMS) microphone assemblies and pressure sensors. Some microphones include tensioned or constrained diaphragms which may reduce the compliance of such diaphragms.

SUMMARY

Embodiments described herein relate generally to methods and processes for fabricating tensioned or constrained diaphragms for MEMS acoustic transducers that have enhanced compliance. In particular, methods and processes described enable fabrication of tensioned diaphragms that have one or more upward and/or downward facing corrugations for increasing a compliance of the diaphragm, the corrugations having smooth corners for reducing stress concentration, therefore increasing diaphragm robustness and reducing failure.

In some embodiments, a capacitive microelectromechanical systems (MEMS) die, comprises a substrate having a through-hole. A diaphragm having an annular corrugation is disposed between a substantially planar central portion and an outer portion, the substantially planar central portion having a conductive portion. The annular corrugation is defined by softened edges or corners at an interface between the annular corrugation and the central and outer portions of the diaphragm. The MEMS die has a back plate having a conductive portion. The back plate and the diaphragm are disposed in spaced-apart relation to form a capacitive structure located over the through-hole of, and supported by, the substrate. The corrugated diaphragm has more compliance than a diaphragm without corrugations.

In some embodiments, a method of fabricating a microelectromechanical systems (MEMS) die comprises forming a trench or a pillar by etching a first structural layer supported by a substrate. A second structural layer is deposited on the trench or pillar, the second structural layer including a depression corresponding to the trench or a bump corresponding to the pillar. Edges or corners of the depression or bump are softened. A diaphragm layer is deposited on the second structural layer after softening, the diaphragm layer including a downward facing corrugation corresponding to the depression or an upward facing corrugation corresponding to the bump. A diaphragm is formed by releasing a portion of the diaphragm layer including the corrugation from the second structural layer. The corrugated diaphragm has greater compliance than a diaphragm without corrugations.

In some embodiments, an acoustic transducer is formed by the process of providing a substrate, and selectively etching the substrate to form at least one of an enclosed trench or an enclosed pillar on the substrate. A first structural layer can be deposited on the substrate where the first structural layer includes at least one of a depression or a bump corresponding to the enclosed trench or the enclosed pillar. The first structural layer can be heated to a temperature above a glass transition temperature of the first structural layer causing the first structural layer to reflow. A diaphragm layer can be deposited over the first structural layer such that the diaphragm layer includes at least one of a downward facing corrugation corresponding to the depression or an upward facing corrugation corresponding to the bump formed in the first structural layer. The diaphragm can then be released, thereby forming a diaphragm suspended over the substrate.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIGS. 1A-1B are schematic illustrations of various operations included in a process for forming the diaphragm of an acoustic transducer including downward facing corrugations, according to an embodiment.

FIG. 3 is a schematic flow diagram of a method for fabricating an acoustic transducer having a diaphragm having an upward or downward facing corrugation defined therein, according to an embodiment.

FIGS. 4A-4C are schematic illustrations of various operations included in a process for forming an acoustic transducer including upward or downward facing corrugations, according to an embodiment.

FIGS. 5A-5D are schematic illustrations of various operations included in a process for forming an acoustic transducer including upward or downward facing corrugations, according to an embodiment; FIG. 5E is an enlarged view of a portion of the acoustic transducer of FIGS. 5A-5D indicate by the arrow A in operation 14a of FIG. 5D.

FIG. 7, panels B-E are scanning electron microscopy (SEM) images of representative samples of the two lots of wafers.

FIGS. 9A-9C are schematic illustrations of various operations included in a process for forming an acoustic transducer including upward or downward facing corrugations, according to an embodiment.

FIGS. 11A-11C are schematic illustrations of various operations included in a process for forming an acoustic transducer including upward or downward facing corrugations, according to an embodiment.

FIGS. 12A-12D are schematic illustrations of various operations included in a process for forming an acoustic transducer including upward or downward facing corrugations, according to an embodiment.

FIGS. 13A-13E are schematic illustrations of various operations included in a process for forming an acoustic transducer including two diaphragms with corrugations, according to an embodiment.

Figure 1B:
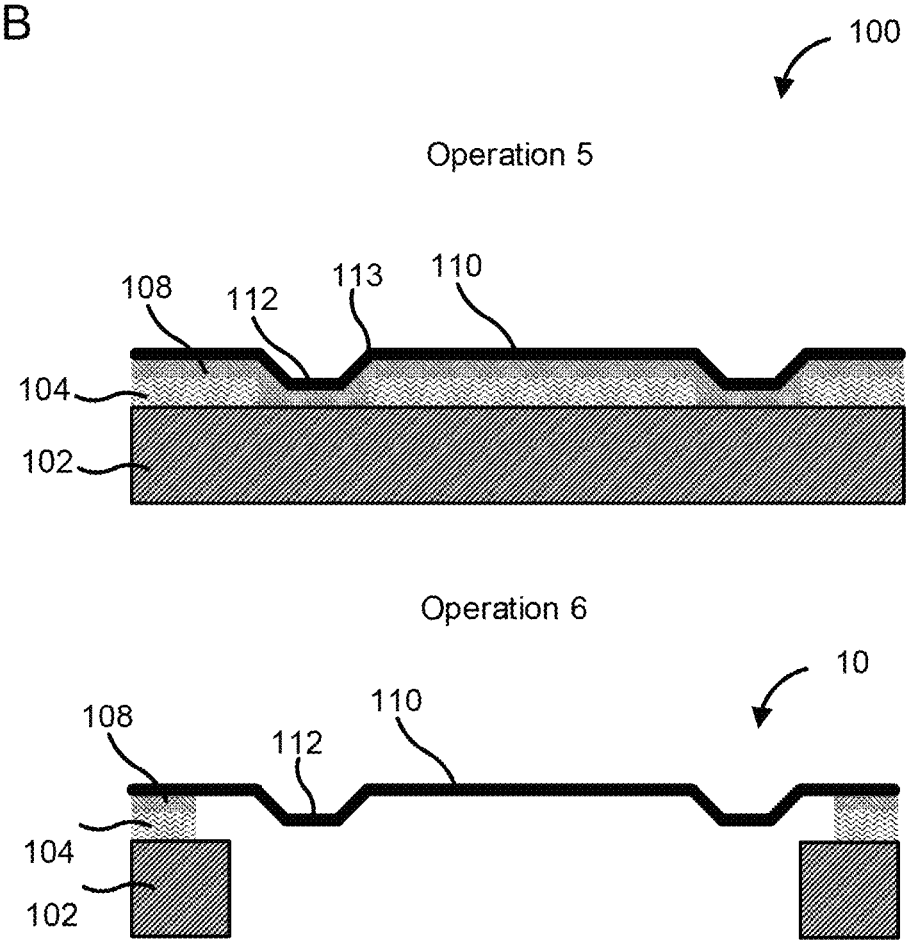

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to methods and processes for fabricating tensioned or constrained diaphragms for MEMS acoustic transducers that have enhanced compliance. In particular, methods and processes described enable fabrication of tensioned diaphragms that have one or more upward and/or downward facing corrugations for increasing a compliance of the diaphragm, the corrugations having smooth corners for reducing stress concentration, therefore increasing diaphragm robustness and reducing failure.

Many acoustic transducers include one or more diaphragms suspended above a back plate, below a back plate or having a back plate interposed therebetween. In some acoustic transducers, the diaphragm may be tensioned or constrained to provide high linearity. However, such tensioned diaphragms may not have sufficiently high compliance, which may cause low sensitivity or movement of the diaphragms in situations in which the acoustic transducer is exposed to sound pressures. Corrugations or ridges, for example, upward or downward facing corrugations, may be formed in such tensioned diaphragms for increasing compliance thereof. Some fabrication processes may yield corrugations having sharp corners (i.e., having a radius of curvature less than 1 µm). Stress may concentrate at such sharp corners, for example, during shock and high pressure events, causing diaphragm failure and reduced robustness.

In contrast, methods and processes described herein provide benefits including, for example: (1) enabling fabrication of diaphragms including corrugations having smooth or rounded corners (i.e., having a radius of curvature at the corners of greater than 1 µm and less than 50 µm) so as to reduce stress concentration and increase robustness; (2) using a simple PSG reflow process to smooth corners in depressions or bumps formed in the PSG layer which serves as a template or mold to form the diaphragm having corrugations with smooth corners; (3) easy integration with current fabrication methods, thereby reducing fabrication complexity and cost; and (4) allowing fabrication of upward facing corrugations, downward facing corrugations or a combination thereof.

As described herein, the terms "downward facing corrugations" refer to corrugations or ridges projecting from the diaphragm towards a substrate on which the diaphragm is suspended, and "upward facing corrugations" refer to corrugations or ridges projecting from the diaphragm away from the substrate.

FIGS. 1A-1B illustrate a process flow 100 for forming an acoustic transducer 10 having a diaphragm 110 including downward facing corrugations or ridges 112, according to an embodiment. The acoustic transducer 10 may include, for example, a MEMS acoustic transducer for use in a MEMS microphone assembly or a MEMS pressure sensor and may be configured to generate electrical signals in response to acoustic signals or atmospheric pressure changes.

At operation 1, a substrate 102 including a first structural layer 104 disposed thereon is provided. The substrate 102 may include, for example, silicon, glass, Pyrex, quartz or any other substrate described herein. The first structural layer 104 may include a first PSG or BPSG layer having a first impurity content, for example, a first phosphorus content in a range between 2% and 6% and may be deposited over the substrate 102 using CVD, LPCVD, PECVD, ALD, any other suitable method or a combination thereof.

At operation 2, one or more enclosed trenches 105 are formed in the first structural layer 104. The enclosed trenches 105 may be formed using a wet etch (e.g., a BHF etch) or a dry etch (e.g., RIE or DRIE etch). The etch may cause the enclosed trenches 105 to have sharp corners and edges. In some embodiments, the one or more enclosed trenches 105 may have a circular cross-section, for example, define a circular trench etched about a longitudinal axis $A_L$ of the substrate 102.

At operation 3, a second structural layer 108 is deposited on the first structural layer 104 such that the second structural layer 108 includes one or more depressions 109 corresponding to the one or more enclosed trenches 105 defined in the first structural layer 104. The depressions 109 formed in the cavities may also have sharp corners and edges corresponding to the sharp edges or corners of the enclosed trenches 105 defined in the first structural layer 104. The second structural layer 108 may include a second PSG layer having a second impurity content, for example, a second phosphorus content.

The second structural layer 108 may have a second phosphorus content larger than the first phosphorus content of the first PSG layer 104, for example, in a range between 4% and 10%. The higher phosphorus content in the second structural layer 108 causes the second structural layer 108 to have a lower glass transition temperature than the first structural layer 104. At operation 4, the second structural layer 108 is heated to a temperature above the glass transition temperature thereof, but below a glass temperature of the first structural layer 104 causing only the second structural layer 108 to reflow, thereby smoothing or rounding the corners and edges of the depressions 109.

At operation 5, a diaphragm layer 110 is deposited on the second structural layer 108 such that the diaphragm layer 110 includes one or more downward facing corrugations 112 projecting therefrom towards the substrate 102. Furthermore, the downward facing corrugations 112 include smooth or rounded corners 113 corresponding to the smooth corners of the depressions 109.

Figure 1C:
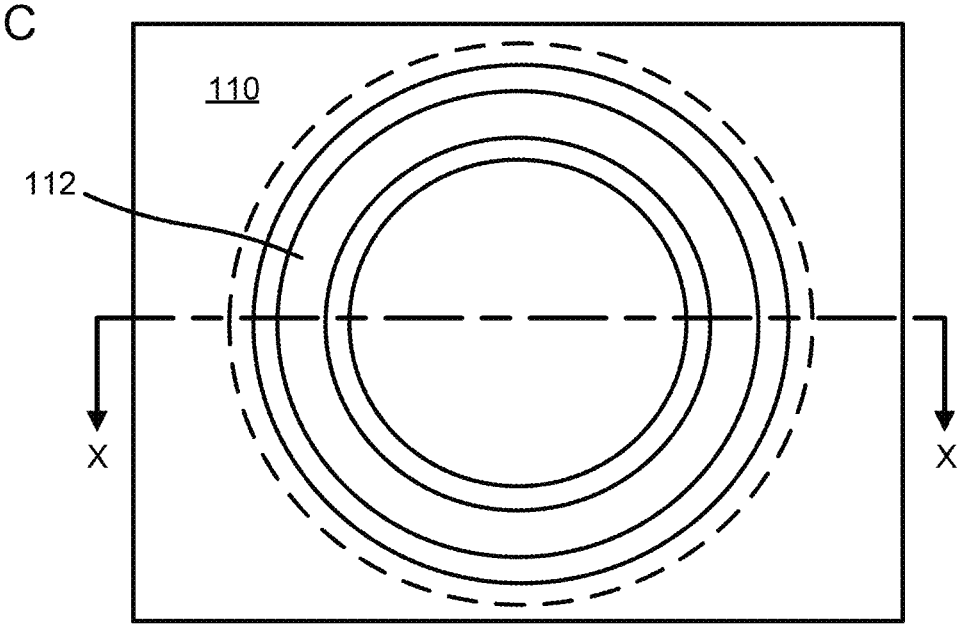
FIG. 1C is a plan view of the diaphragm of the acoustic transducer formed using the process of FIGS. 1A-1B, with FIG. 1B, operation 6 representing a side cross-section view of the FIG. 1C taken along the line X-X in FIG. 1C.

At operation 6, at least a portion of the substrate 102, the first structural layer 104 and the second structural layer 108 is etched so as to leave a diaphragm 110 having downward facing corrugations 112 suspended over the substrate 102, thereby forming the acoustic transducer 10. In some embodiments, the downward facing corrugations 112 may include circumferential corrugations, for example, corresponding to circular enclosed trenches 105 initially formed in the first structural layer 104. FIG. 1C shows a plan view of the diaphragm 110 showing the downward facing corrugation 112. While shown as including a pair of corrugations 112, any number of corrugations may be formed in the diaphragm 110. In various embodiments, the corrugations 112 may have a depth in a range of 0.5 microns to 5 microns (e.g., 0.5, 1, 2, 3, 4 or 5 microns inclusive of all ranges and values therebetween).

Figure 2A:
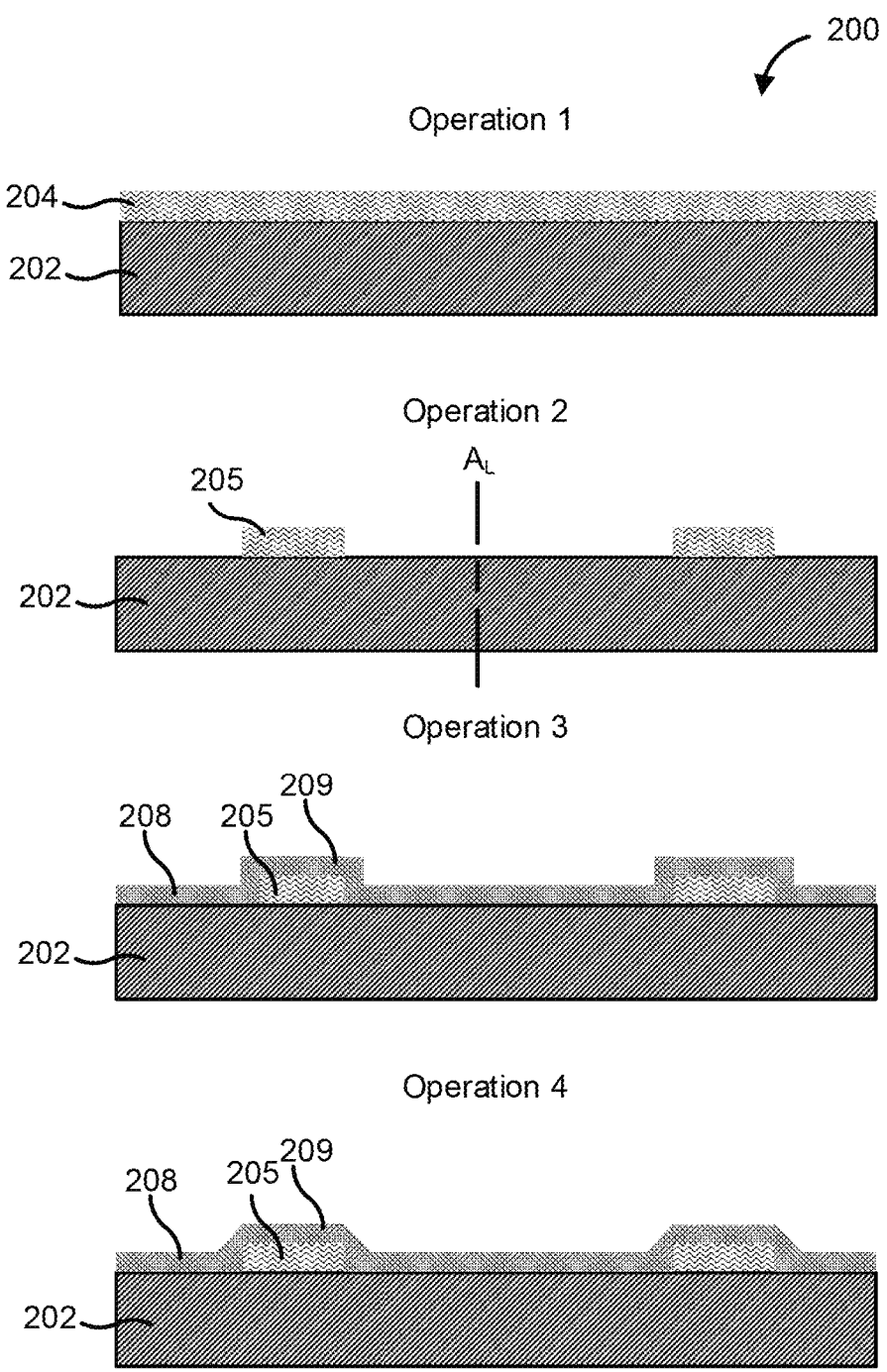
FIGS. 2A-2B are schematic illustrations of various operations included in a process for forming the diaphragm of an acoustic transducer including upward facing corrugations, according to an embodiment.
Figure 2B:
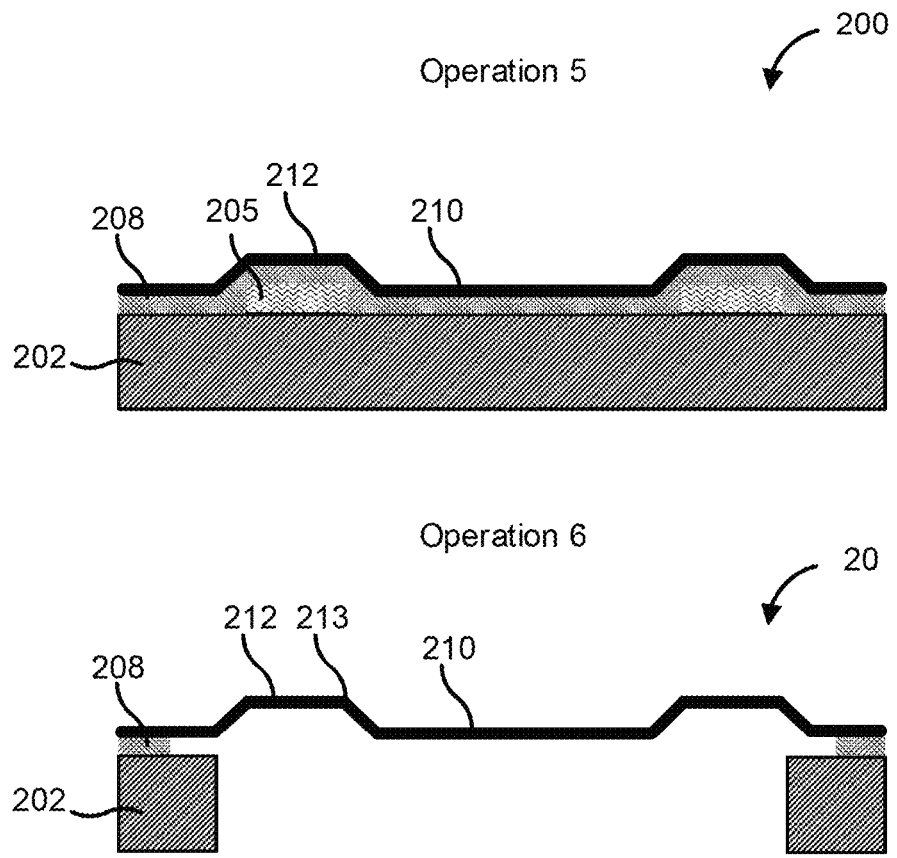

FIGS. 2A-2B illustrates a process flow 200 for forming an acoustic transducer 20 having a diaphragm 210 including upward facing corrugations 212, according to an embodiment. The acoustic transducer 20 may include, for example, a MEMS acoustic transducer for use in a MEMS microphone assembly or a MEMS pressure sensor and may be configured to generate electrical signals in response to acoustic signals or atmospheric pressure changes.

At operation 1, a substrate 202 including a first structural layer 204 disposed thereon is provided. The substrate 202 may include, for example, glass, silicon, Pyrex, quartz or any other substrate described with respect to the method 300, 700. The first structural layer 204 may have an impurity, for example, a first amount of phosphorus or first phosphorus content in a range between 2% and 6% and may be deposited over the substrate 202 using CVD, LPCVD PECVD, ALD, any other suitable method or a combination thereof.

At operation 2, one or more enclosed pillars 205 are formed in the first structural layer 204. The enclosed pillar 205 may be formed using a wet etch (e.g., a BHF etch) or a dry etch (e.g., RIE or DRIE etch) to remove large portions of the first structural layer 204, leaving the enclosed pillar 205 standing on the substrate 202. The enclosed pillar 205 may, for example, define an enclosed circular pillar formed about a longitudinal axis $A_L$ of the substrate 202 and extending towards the substrate 202. The etch may cause the enclosed pillars 205 to have sharp corners and edges. At operation 3, a second structural layer 208 is deposited on the substrate and the enclosed pillar 205 formed from the first structural layer 204 such that the second structural layer 208 includes one or more bumps 209 corresponding to the one or more pillars. The bumps 209 formed on the enclosed pillar 205 may also have sharp corners and edges corresponding to the sharp edges or corners of the enclosed pillar 205 defined from the first structural layer 204.

The second structural layer 208 may have a second impurity content, for example, a second phosphorus content larger than the first phosphorus content of the first structural layer 204, for example, in a range between 4% and 10% and thereby, a lower glass transition temperature than the first structural layer 204. At operation 4, the second structural layer 208 is heated to a temperature above the glass transition temperature thereof, but below a glass temperature of the first structural layer 204 causing only the second structural layer 208 to reflow, thereby smoothing or rounding the corners and edges of the bumps 209.

Figure 2C:
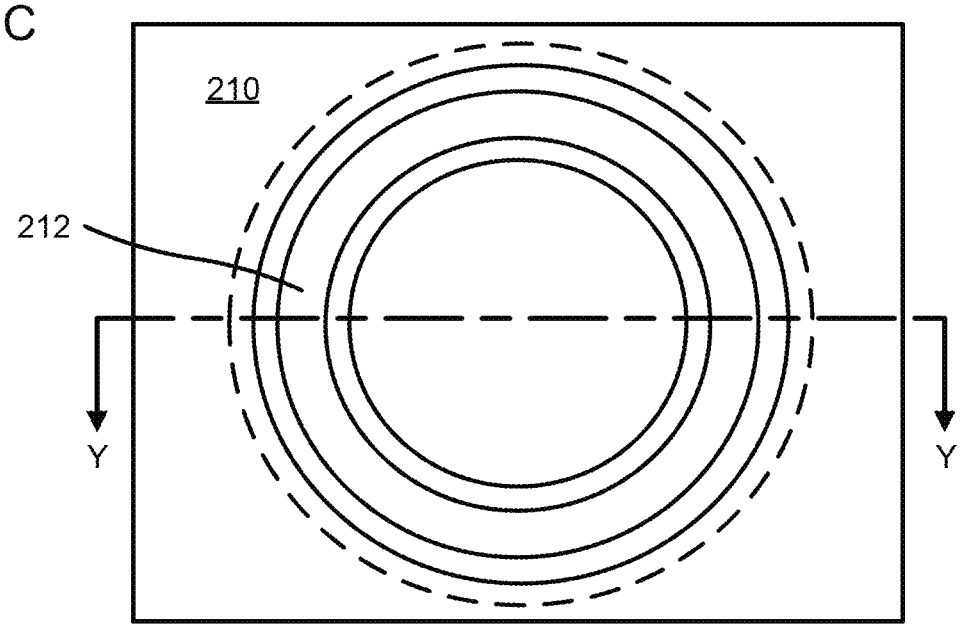
FIG. 2C is a plan view of the diaphragm of the acoustic transducer formed using the process of FIGS. 2A-2B, with FIG. 2B, operation 6 representing a side cross-section view of the FIG. 2C taken along the line Y-Y in FIG. 2C.

At operation 5, a diaphragm layer 210 is deposited on the second structural layer 208 such that the diaphragm layer 210 includes one or more upward facing corrugations 212 projecting therefrom away from the substrate 202. Furthermore, the upward facing corrugations 212 include smooth or rounded corners 213 corresponding to the smooth corners of the bumps 209. At operation 6, at least a portion of the substrate 202 and the first structural layer 204 as well as the pillars 205 are etched so as to leave the diaphragm layer 210 forming a diaphragm having upward facing corrugations 212 suspended over the substrate 202, thereby forming the acoustic transducer 20. In some embodiments, the upward facing corrugations 212 include enclosed circumferential corrugations and may have a height in a range of 0.5 microns to 5 microns (e.g., 0.5, 1, 2, 3, 4 or 5 microns inclusive of all ranges and values therebetween). For example, FIG. 2C shows a plan view of the diaphragm 210 showing the upward facing corrugation 212 formed as an enclosed circular wall or pillar extending away from the substrate 202.

FIG. 3 is a schematic flow diagram of an example method 300 for fabricating an acoustic transducer (e.g., the acoustic transducer 10, 20, 40, 50, 80, 90) including a diaphragm that includes upward or downward facing corrugations having smooth or rounded corners. The acoustic transducer may include, for example, a MEMS acoustic transducer for use in a MEMS microphone assembly or a MEMS pressure sensor, and may be configured to generate electrical signals in response to acoustic signals or atmospheric pressure changes.

The method comprises providing a substrate, at 302. The substrate may be formed from silicon, silicon oxide, glass, Pyrex, quartz, ceramics, or any other suitable material, and may include the substrate 102, 202, 402 or 502, or 802 as described herein in detail with respect to processes 100, 200, 400, 500, or 800. In some embodiments, a back plate layer (e.g., the back plate layer 403, 503) is deposited on the substrate layer, at 304. The back plate layer may be formed from a low stress material, for example low stress silicon nitride (LSN), low stress oxide or any other suitable material. The back plate layer may be deposited using physical vapor deposition (PVD), chemical vapor deposition (CVD), low pressure chemical vapor deposition (LPCVD), plasma enhanced CVD (PECVD), atomic layer deposition (ALD), any other suitable process or a combination thereof. The back plate layer may be relatively inflexible relative to a diaphragm to be formed on the substrate.

In some embodiments, a first conducting layer (e.g., the first conducting layer 416, 516, 816, 916 described with respect to the process 400, 500, 800, 900) is deposited on the back plate layer, at 306. In some embodiments, the first conducting layer may be formed from polysilicon (poly). In other embodiments, the first conducting layer may be formed from metals (e.g., gold, platinum, etc.), doped silicon or any other suitable conductive material. The first conducting layer may be deposited using PVD, thermal evaporation, e-beam evaporation, CVD, PECVD, LPCVD, ALD, or any other suitable process or a combination thereof.

At 308, apertures may be formed through the back plate layer and the first conducting layer. For example, a wet etching process or a dry etching process (e.g., reactive ion etching (ME), deep RIE (DRIE), focused ion beam etching (FIB), etc.) or any other suitable etching process may be used to form corresponding apertures in the back plate and the first conducting layer. The apertures may have any suitable shape, for example, square, rectangular, oblong, circular, oval, polygonal (e.g., hexagonal, octagonal, etc.) or any other suitable shape.

At 310, the first conducting layer may be selectively etched (e.g., using a wet or dry etching process) to form an electrical contact on the back plate. For example, the radial or circumferential etches of the first conducting layer may be selectively etched to form the electrical contact on the back plate.

At 312, a first structural layer is deposited on the substrate. In various embodiments, the first structural layer may include a first PSG layer having a first phosphorus content. For example, the first PSG layer 406, 506, 806, 906 may be deposited on the substrate. In other embodiments, the structural layer may include a borophosphosilicate glass (BPSG) layer, an oxide, a nitride or any other suitable material.

At 314, the first structural layer is selectively etched to form one or more enclosed trenches or pillars in the structural layer. In some embodiments, the first structural layer (e.g., a first PSG layer) is selectively etched using a wet etch process (e.g., using buffered hydrofluoric acid (BHF)) up to the back plate layer, such that portions of the structural layer in the areas being etched is completely removed (e.g., as described herein with respect to the process 100, 200, 400, 800). In such embodiments, the back plate layer may serve as an etch stop for the wet etch process. In other embodiments, the structural layer may be selectively etched using a timed dry etch process (e.g., an RIE or DRIE process) such that the dry etch does not reach the back plate layer (e.g., as described herein with respect to the process 500, 900). For example, the dry etch process may be performed for a predetermined time such that a portion of the first structural layer remains disposed over the substrate or, in some embodiments, the back plate layer. The enclosed trenches or enclosed pillars defined in the first structural layer may have sharp corners (e.g., having a radius of curvature less than 1 μm). In some embodiments in which the first structural layer comprises a first PSG layer, the first PSG layer may be heated above a glass transition temperature thereof causing the first PSG layer to reflow, thereby rounding the corners of the first PSG layer (e.g., cause the corners to have a radius of curvature of greater than 1 μm and less than 50 μm).

At 316, a second structural layer having an impurity content, for example, a second PSG layer (e.g., the second PSG layer 108, 208, 408, 508, 808, 908) having a phosphorus content is deposited on the first structural layer. The second structural layer may be conformally deposited (i.e., uniformly disposed so as to adhere to the contours of the underlying first structural layer) such that the second structural layer includes one or more depressions or bumps corresponding to the one or more cavities or pillars, respectively already formed in the first structural layer. In some embodiments, the impurity may comprise phosphorus such that the phosphorus content is greater than 2%.

At 318, the second structural layer is heated above a glass transition temperature of the second structural layer causing the second structural layer to reflow. Expanding further, the enclosed trenches or pillars formed in the structural layer at operation 314 may have sharp corners and edges (e.g., having a radius of curvature of less than 1 μm). Since the second structural layer is conformally deposited on the first structural layer, the second structural layer follows the contours of the first structural layer such that the depressions and or bumps included in the second structural layer also has the sharp corners and edges. Heating the second structural layer above the glass transition temperature causes a phase change in the second structural layer allowing it to reflow. The reflowing smoothens or rounds the corners and edges of the depressions or bumps formed in the second structural layer such that the corners and edges of the second structural layer may have a radius of curvature greater than 1 μm and less than 50 μm.

In some embodiments, the first structural layer is formed of PSG having a first phosphorus content, and the second structural layer is formed of PSG having a second phosphorus content different than the first phosphorus content. In other embodiments, the first phosphorus content may be equal to the second phosphorus content.

In some embodiments, the first phosphorus content included in the first structural layer may be between 2% and 6% and the second phosphorus content included in the second structural layer may be between 4% and 10%. In such embodiments, the second structural layer may have a higher amount of phosphorus than the first structural layer. The higher amount of phosphorus lowers the glass transition temperature of the second structural layer relative to a glass transition temperature of the first structural layer. The heating may be performed to a temperature which is higher than the glass transition temperature of the second structural layer but lower than the glass transition temperature of the first structural layer, thus causing only the second structural layer to flow and rounding the corners thereof, without causing the first structural layer to reflow.

In other embodiments, the first phosphorus content included in the first structural layer is between 4% and 10% and the second phosphorus content in the second structural layer is between 2% and 6% such that the second structural layer has a lower phosphorus content and, therefore a higher glass transition temperature than the first structural layer. In such embodiments, the first structural layer may be heated to a glass transition temperature thereof before the depositing the second structural layer on the first structural layer. In some embodiments, second structural layer may be heated to a temperature which is greater than a glass transition temperature of each of the first structural layer and the second structural layer so as to cause each of the first and second structural layers to reflow. This may yield smoother corners and edges in the second structural layer.

At 322, a diaphragm layer is deposited on the second structural layer such that the diaphragm layer includes downward facing corrugations corresponding to the one or more depressions, upward facing corrugations corresponding to the one or more bumps formed in the second structural layer or a combination thereof. For example, a low stress material, for example LSN or a low stress ceramic may be deposited on the second structure layer (e.g., via a physical or chemical vapor deposition process). In other embodiments, the diaphragm layer may include a dielectric or conductive material (e.g., silicon oxide, silicon nitride, silicon carbide, gold, aluminum, platinum, etc.). The second structural layer acts as a mold or template for the diaphragm layer such that each of the downward facing corrugations or upward facing corrugations defined in the diaphragm layer have a radius of curvature corresponding to the second radius of curvature, i.e. radius of curvature after reflow. In this manner, the stress concentration is reduced at the edges or corners of the corrugations increasing robustness and shock resistance.

In some embodiments, before depositing a diaphragm layer on the second structural layer, a second conducting layer is deposited and patterned on the second structural layer, at 320. The second conducting layer may be formed from poly or any other conductive material. At least a portion of the diaphragm layer may contact the second conducting layer such that the second conducting layer forms an electrical contact with the diaphragm layer.

At 324, the diaphragm layer is released, thereby forming a diaphragm suspended on the substrate. For example, releasing the diaphragm may comprise etching through each of the substrate, the first structural layer and the second structural layer. Expanding further, a back side etch may be performed to etch the substrate so as to define an opening therethrough so as to release the diaphragm from the substrate side. In particular embodiments, the substrate may include a thin oxide (e.g., $SiO_2$) layer disposed on a first surface thereof facing the diaphragm. For example, the oxide layer may be deposited or grown on the substrate before depositing the first structural layer or otherwise the back plate layer thereon. The oxide layer may serve as an etch stop for the back side substrate etch.

The back side etch may be continued or another back side etch may subsequently be performed through the apertures defined in the back plate layer to remove the first structural layer and the second structural layer and release the diaphragm. In other embodiments, the back plate layer may be disposed above the diaphragm such that the diaphragm is disposed between the substrate and the back plate. In such embodiments, the subsequent etch may include a front side etch performed through the apertures defined in the back plate.

Figure 5B:
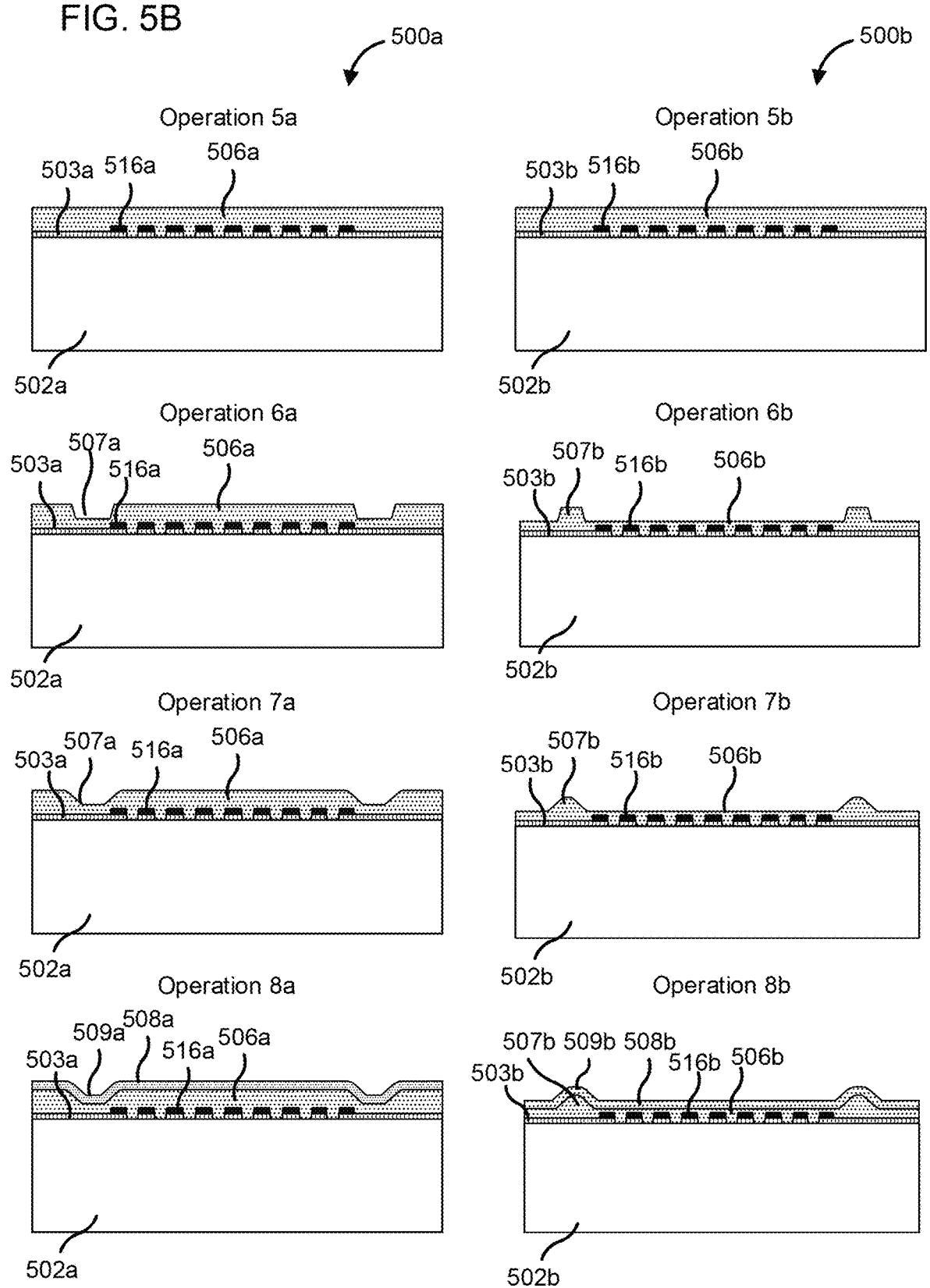

In various embodiments, releasing the diaphragm also releases the back plate layer, thereby forming a back plate suspended over the substrate above or below the diaphragm. In some embodiments, etching of the first and second structural layers may be performed for a predetermined time such that a portion of the first structural layer and a portion of the second structural layer proximate to the upward facing corrugations or downward facing corrugations of the diaphragm layer is not removed so as to form a perimetral (also referred to as "peripheral") support structure (e.g., as shown in FIG. 5E). The portions of the first structural layer and/or the second structural layer may facilitate rounding of the corners and edges of the upward or downward facing corrugations formed in the diaphragm. In some embodiments, an inner radial edge of the portion of the second structural layer is positioned closer to the downward facing corrugation or upward facing corrugation defined in the diaphragm layer relative to an inner radial edge of the portion of the first structural layer. In other words, an inner sidewall of the portions of the first and second structural layers may be tapered from a first edge thereof proximate to the substrate towards a second edge proximate to the diaphragm layer such that the second edge is radially closer to the downward or upward facing corrugations relative to the first edge.

In some embodiments, the diaphragm formed using the method 300 may have a compliance which is at least two times more than a compliance of a similar constrained diaphragm that does not include the corrugations. Furthermore, the diaphragm may be able to withstand a pressure differential in between a range of 50 to 70 psi. While not shown, in some embodiments, the method 300 may also include forming a piercing or through-hole through the diaphragm and optionally, the back plate, for example to allow pressure equalization between a front volume and a back volume of the acoustic transducer formed using the method 300.

Figure 4B:
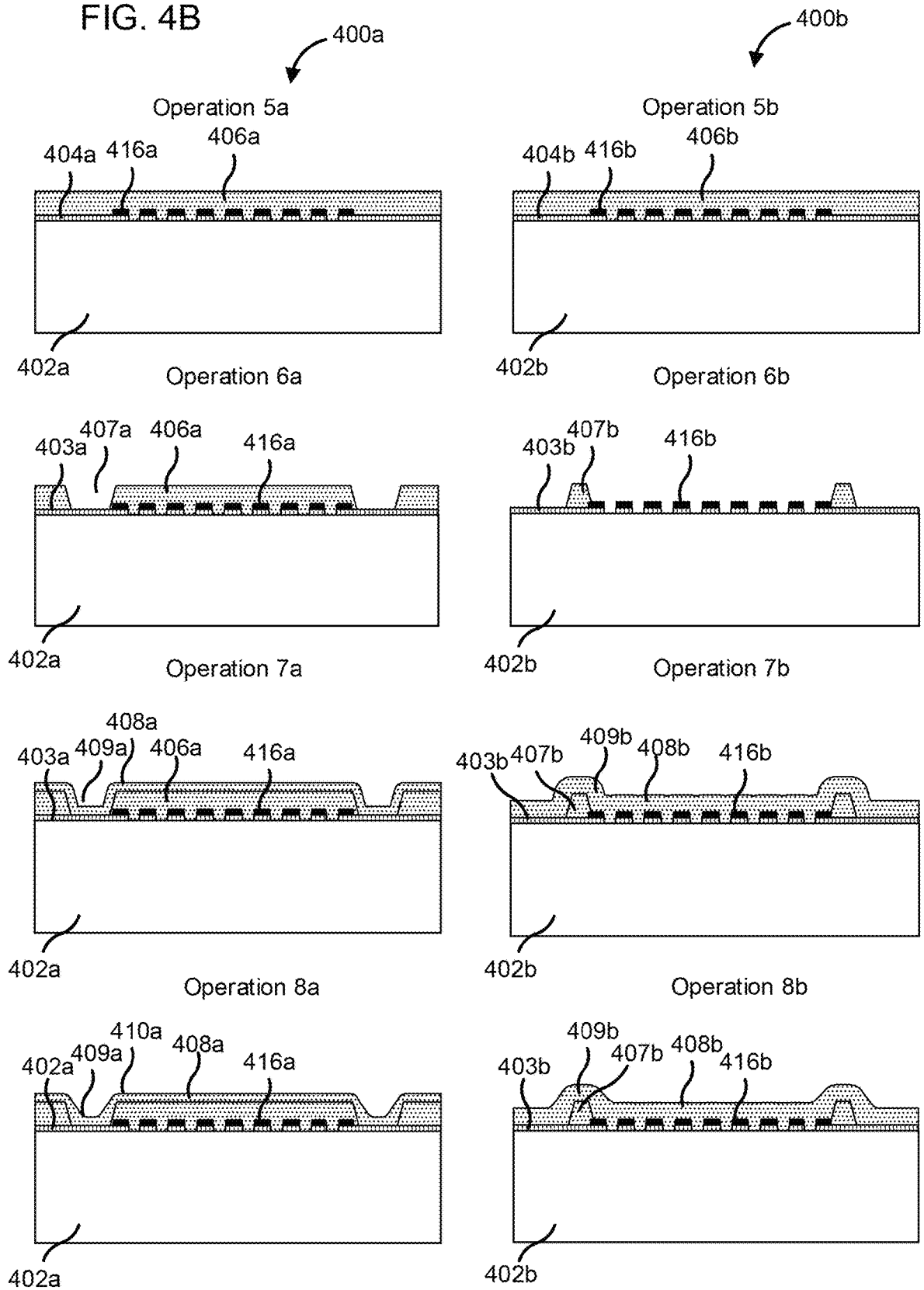

FIGS. 4A-4C illustrate process flows 400a/b for forming acoustic transducers 40a and 40b having downward and upward facing corrugations, respectively, according to an embodiment. The process 400a/b include providing a substrate 402a/b (e.g., a glass, Pyrex, quartz, silicon, silicon oxide or any other suitable substrate), at operation 1a/b.

At operation 2a/b a back plate layer 403a/b is deposited on the substrate 402a/b and a first conducting layer 416a/b is deposited on the back plate layer 403a/b. In some embodiments, the back plate layer 403a/b may include, for example, a LSN layer, and the first conducting layer 416a/b may include a conducting material (e.g., poly). At operation 3a/b, a plurality of apertures 417a/b are defined in the back plate layer 403a/b and the first conducting layer 416a/b, for example, using a wet or dry etching process. At operation 4a/b, the first conducting layer is selectively etched to form an electrical contact on the back plate layer 403a/b.

At operation 5a/b, a first structural layer 406a/b, for example, a first PSG or BPSG layer is deposited on the back plate layer 403a/b. The first structural layer 406a/b may be planarized (e.g., via CMP) after deposition on the back plate layer 403a/b. The first structural layer 406a/b may have an impurity content, for example, a first phosphorus content in a range between 2% and 5%. At operation 6a one or more enclosed trenches 407a are etched in the first structural layer 406a to serve as templates for forming downward facing corrugations in a diaphragm. In contrast, the first structural layer 406b is etched so as to form one or more enclosed pillars 407b from the first structural layer 406b to serve as templates for forming upward facing corrugations in a diaphragm. In particular embodiments, a wet etch process may be used etch the first structural layer 406a/b up to the back plate layer 403a/b disposed therebeneath, the back plate layer 403a/b serving as an etch stop for the wet etch.

At operation 7a/b, a second structural layer 408a/b, for example, a second PSG or BPSG layer having a second impurity content, for example, a second phosphorus content larger than the first impurity content so as to have a lower glass transition temperature than the first structural layer 406a/b is deposited on the first structural layer 406a/b and the open areas of the back plate layer 403a/b. The second structural layer 408a/b is conformally deposited on the first structural layer 406a/b so as to include one or more depressions 409a corresponding to the one or more enclosed trenches 407a formed in the first structural layer 406a, or one or more bumps 409b corresponding to the one or more enclosed pillars 407b formed from the first structural layer 406b. The enclosed trenches 407a or the enclosed pillars 407b may have sharp corners, as previously described herein.

At operation 8a/b, the second structural layer 408a/b is heated to a temperature above a glass transition temperature of the second structural layer 408a/b. This causes the second structural layer 408a/b to reflow which smooths or rounds the sharp edges and corners of depressions 409a and the bumps 409b formed in the second structural layer 408a/b.

At operation 9a/b a second conducting layer 418a/b (e.g., a poly layer) is deposited on the second structural layer 408a/b and patterned. At operation 10a/b, each of the second structural layer 408a/b and the first structural layer 406a/b are etched along the edges of each layers up to the back plate layer 403a/b so as to provide space for sealing a diaphragm layer 410a/b to the back plate layer 403a/b.

At operation 11a/b, the diaphragm layer 410a/b (e.g., a LSN layer) is deposited on the second structural layer 408a/b such that the diaphragm layer 410a includes one or more downward facing corrugations 412a corresponding to the one or more depressions 409a formed in the second structural layer 408a, or one or more upward facing corrugations 412b corresponding to the one or more bumps 409b formed in the second structural layer 408b. Furthermore, the diaphragm layer 410a/b contacts the back plate layer 403a/b so as to seal the edges of the acoustic transducer 40a/b. At operation 12a/b, a portion of the substrate 402a/b, and a bulk of the first structural layer 406a/b and the second structural layer 408a/b are etched (e.g., through the apertures 417a/b defined in the back plate layer 403a/b) so as to release the diaphragm layer 410a/b as well as the back plate layer 403a/b, thereby forming a diaphragm and back plate of the acoustic transducer 40a/b.

While operations of the method 400a/b result in the back plate 416a/b being disposed below the diaphragm 410a/b, in other embodiments, a back plate may be disposed above a diaphragm that includes corrugations (e.g., the diaphragm 410a/b). In such embodiments, a second structural layer is deposited on the diaphragm layer (e.g., the diaphragm layer 410a/b). A back plate layer is deposited on the second structural layer; and plurality of apertures are formed (e.g., etched) in the back plate layer. The apertures enable an etchant used to release the diaphragm layer to pass through the back plate and etch the second structural layer such that releasing the diaphragm also releases the back plate layer, thereby forming a back plate suspended on the substrate (e.g., the substrate 402a/b) over the diaphragm.

FIGS. 5A-5D illustrate process flows 500a/b for forming acoustic transducers 50a and 50b having downward and upward facing corrugations, respectively, according to an embodiment. The process 500a/b include providing a substrate 502a/b (e.g., a glass, Pyrex, quartz, silicon, silicon oxide or any other suitable substrate), at operation 1a/b.

Figure 6:
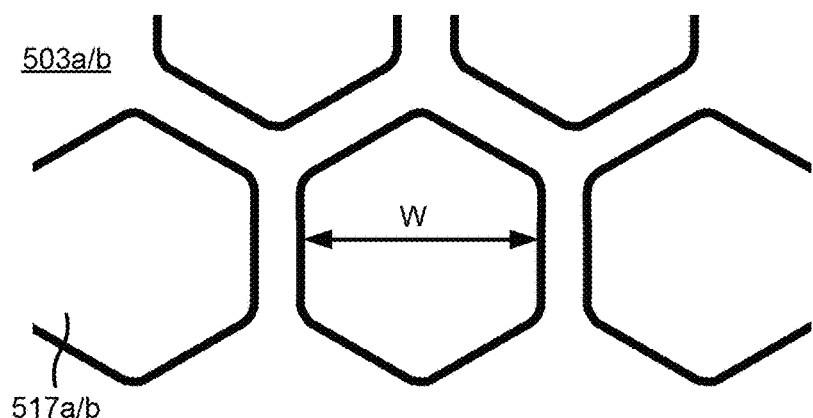
FIG. 6 is a top view of a portion of a back plate layer of the acoustic transducer of FIGS. 5A-5D showing a plurality of apertures formed therein, according to an embodiment.

At operation 2a/b, a back plate layer 503a/b is deposited on the substrate 502a/b and a first conducting layer 516a/b is deposited on the back plate layer 503a/b. In some embodiments, the back plate layer 503a/b may include, for example, a LSN layer, and the first conducting layer 516a/b may include a conducting material (e.g., poly). At operation 3a/b, a plurality of apertures 517a/b are defined in the back plate layer 503a/b and the first conducting layer 516a/b, for example, using a wet or dry etching process. The apertures 517a/b may have any suitable shape, for example, square, rectangular, circular, oval, oblong, polygonal, etc. In particular embodiments, the apertures 517a/b may have a hexagonal shape with rounded corners. For example, FIG. 6 shows a top view of a portion of the back plate layer 503a/b having hexagonal apertures 517a/b defined therein. In particular embodiments, the hexagonal apertures 517a/b may have a width W between parallel sides thereof in a range between 10 and 20 microns (e.g., 10, 12, 14, 16, 18 and 20 microns inclusive of all ranges and values therebetween) and a pitch of 10-30 microns (e.g., 10, 15, 25 or 30 microns inclusive of all ranges and values therebetween).

At operation 4a/b, the first conducting layer 516a/b is selectively etched to form an electrical contact on the back plate layer 503a/b. At operation 5a/b, a first structural layer 506a/b is deposited on the substrate 502a/b. The first structural layer 506a/b may include a PSG or BPSG layer have a first impurity content, for example, a first phosphorus content in a range between 4% and 10%. In some embodiment, the first structural layer 506a/b may be planarized (e.g., via CMP) after deposition on the back plate layer 503a/b.

At operation 6a, enclosed trenches 507a are formed in the first structural layer 506a to serve as templates for forming downward facing corrugations in a diaphragm. In contrast, in operation 6b, the first structural layer 506b is etched so as to form enclosed pillars 507b from the first structural layer 506b which serve as templates for a upward facing corrugations to be formed in a diaphragm. In particular embodiments, the first structural layer 506a/b is etched using a timed dry etch process such that the dry etch does not reach the back plate layer 503a/b and portions of the first structural layer 506a/b remain disposed on the entire back plate layer 503a/b.

At operation 7a/b, the first structural layer 506a/b is heated to a temperature above a glass transition temperature of the first structural layer 506a/b so as to cause the first structural layer 506a/b to reflow and smoothen the edges or corners of the enclosed trenches 507a or enclosed pillars 507b defined in the first structural layer 506a and 506b, respectively. At operation 8a/b, a second structural layer 508a/b, for example, a second PSG or BPSG layer is deposited over the first structural layer 506a/b, such that the second structural layer 508a/b includes depressions 509a or bumps 509b corresponding to the enclosed trenches 507a or enclosed pillars 507b, respectively defined in the first structural layer 506a/b. The second structural layer 508a/b may have a second impurity content, for example, a second phosphorus content lower than the first impurity content (e.g., a first phosphorus content) of the first structural layer 506a/b (e.g., in a range between 2% and 6%), therefore having a glass transition temperature higher than the first structural layer 506a/b.

At operation 9a/b, the second structural layer 508a/b is heated to a temperature above the glass transition temperature thereof, so as to cause the second structural layer 508a/b to reflow, further rounding the corners of the depressions 509a and bumps 509b. At operation 10a/b, a second conducting layer 518a/b is deposited and patterned on the second structural layer 508a/b. At operation 11a/b, each of the second structural layer 508a/b and the first structural layer 506a/b are etched along the edges of each layers up to the back plate layer 503a/b so as to provide space for sealing a diaphragm layer 510a/b to the back plate layer 503a/b.

At operation 12a/b, a diaphragm layer 510a/b (e.g., a LSN layer) is deposited on the second structural layer 508a/b such that the diaphragm layer 510a includes one or more downward facing corrugations 512a corresponding to the one or more depressions 509a formed in the second structural layer 508a, or one or more upward facing corrugations 512b corresponding to the one or more bumps 509b formed in the second structural layer 508b. Furthermore, the diaphragm layer 510a/b contacts the back plate layer 503a/b at radial edges thereof, so as to seal the edges of the acoustic transducer 50a/b. At operation 13a/b, a portion of the substrate 502a/b is etched, and at operation 14a/b, a bulk of the first structural layer 506a/b and the second structural layer 508a/b is etched (e.g., through the apertures 517a/b defined in the back plate layer 503a/b) so as to release the diaphragm layer 510a/b as well as the back plate layer 503a/b, thereby forming a diaphragm and back plate of the acoustic transducer 50a/b.

FIG. 5E shows an enlarged view of a portion of the acoustic transducer 50a indicated by the arrow A in FIG. 5D operation 14a. As shown in FIG. 5E, the first and second structural layers 506a/b and 508a/b are etched for a predetermined time such that a portion 522a of the first structural layer 506a and a portion 522b the second structural layer 508b proximate to perimetral edge of the diaphragm layer 510a/b and the downward facing corrugations 512a or upward facing corrugations 512b of the diaphragm layer 510a and 510b, respectively is not removed. The remaining portions 522a and 522b of the first and/or second structural layers 506a/b and 508a/b may facilitate rounding of the corners and edges of the downward or upward facing corrugations 512a and 512b formed in the diaphragm layer 510a/b by forming a perimetral support structure 522 for increasing strength and robustness of the diaphragm 510a/b. The portion 522b of the second structural layer 508a contacts the diaphragm layer 510a. Furthermore, an inner radial edge 524b of the portion 522b of the second structural layer 508a proximate to the diaphragm layer 510a is positioned radially closer to the downward facing corrugation 512a defined in the diaphragm layer 510a relative to an inner radial edge 524a of the portion 522a of the first structural layer 506a proximate to the substrate 502a. This may be due, for example, to the first structural layer 506a and the second structural layer 508a having different impurity contents (e.g., different phosphorus contents) which causes unequal etching, or due to proximity of the first structural layer 506a to an isotropic etch front.

Figure 7:
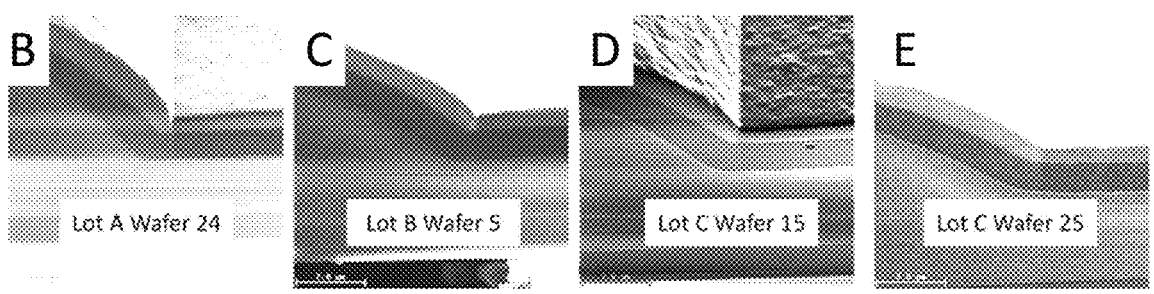
FIG. 7, panel A is a table summarizing diaphragms including downward facing corrugations formed in two wafer lots using various methods, the shape of their edges (or corners) and associated pressure at which the diaphragms fail.

FIG. 7, panel A summarizes failing pressure of various representative sample wafer included in three wafer lots (lots A, B, and C) that include diaphragms having corrugations with sharp and degrees of smooth edges and formed using wet or dry etching. The diaphragms included in each of the wafer lots were tested by applying pressure to one side of the diaphragm until failure of the diaphragm.

Representative wafer 24 included in lot A includes a diaphragm having downward facing corrugations formed by etching a cavity in a PSG layer via dry etching. FIG. 7, panel B is an SEM image of the representative sample wafer 24 of included in lot A. Focused Ion Beam (FIB) etching was used to section the wafer 24 so as to allow imaging of a cross-section of the diaphragm included in the wafer 24. The diaphragms included in lot A wafer 24 failed at a pressure of about 9 psi.

Representative wafer 5 included in lot B includes a diaphragm having downward facing corrugations formed by etching a cavity in a PSG layer via a wet etch process. The corrugations have a depth at a center of the diaphragm of about 4.00 µm and at the edges of about 4.45 µm, and include rounded corners. FIG. 7, panel C is an SEM image of lot B wafer 5. The diaphragms included in the wafer 5 failed at a pressure of about 18 psi.

Representative wafer 15 included in lot B includes corrugations having a depth at a center of the diaphragm of about 4.45 µm and at the edges of about 4.83 µm, and includes rounded corners. FIG. 7, panel D is an SEM image of the representative sample wafer 15. The diaphragms included in lot B wafer 15 failed at a pressure of about 34 psi.

Figure 8:
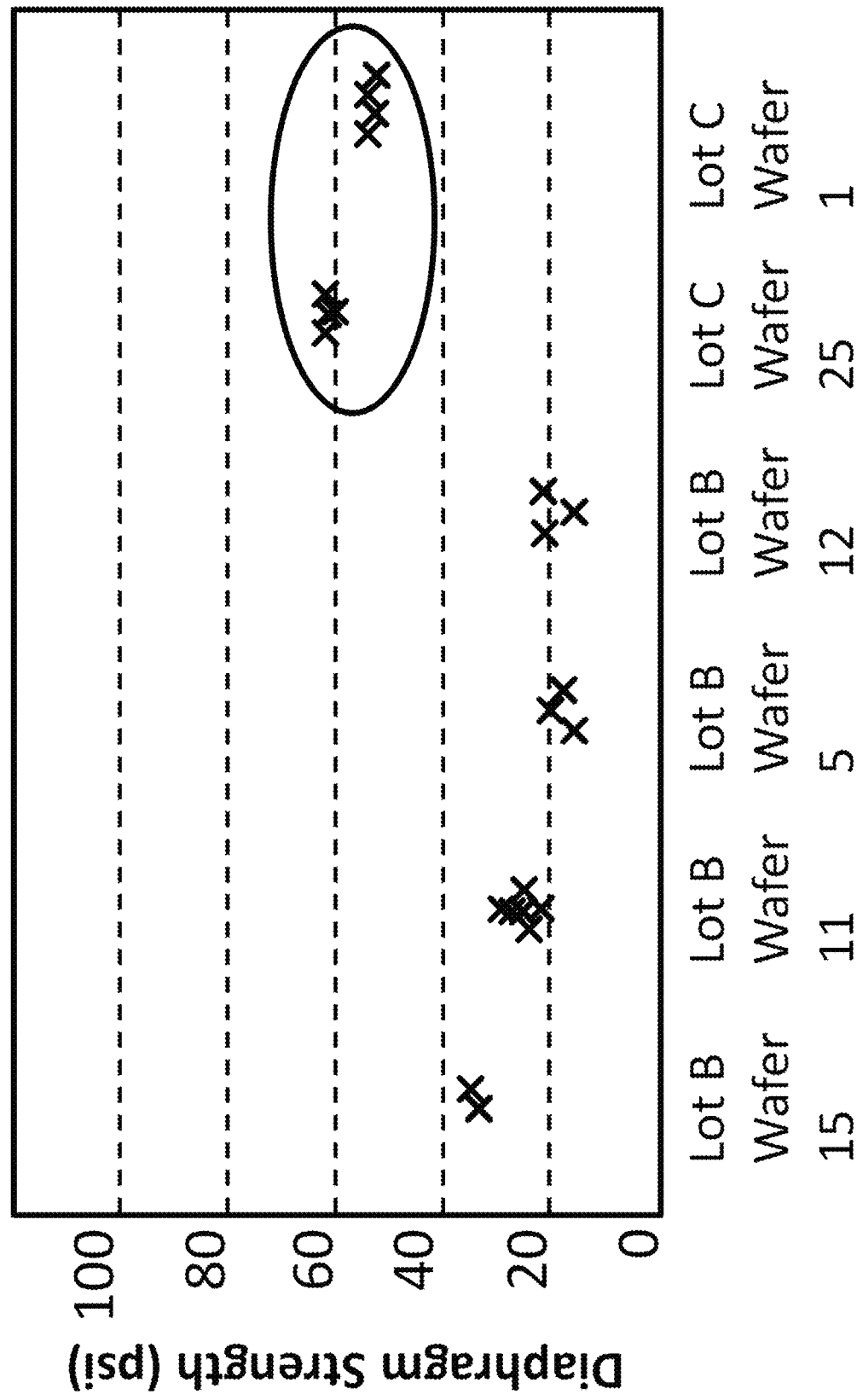
FIG. 8 is a plot of diaphragm strength of diaphragms formed in representative samples of the two lots of wafers of FIG. 7A.

Representative wafer 25 included in lot C which was formed using dry etching, includes corrugations having a depth at a center of the diaphragm of about 3.66 µm and at the edges of about 3.32 µm, and includes rounded corners. Corrugation depth is shallowest among the group of wafers in FIG. 7, panel A. While etching corrugations, unetched PSG was intentionally left at the bottom resulting in the smoothest corners after PSG reflow as described in relation to operation 6a/b and 7a/b of FIG. 5B. FIG. 7, panel E is an SEM image of the representative sample wafer 25 lot C. The diaphragms included in the wafer 25 failed at a pressure of about 60 psi. FIG. 8 is a scatter plot of diaphragm failures of various diaphragms formed using the methods described herein, showing that the smoothing the corrugations increases the failure strength of the diaphragms.

Figure 9A:
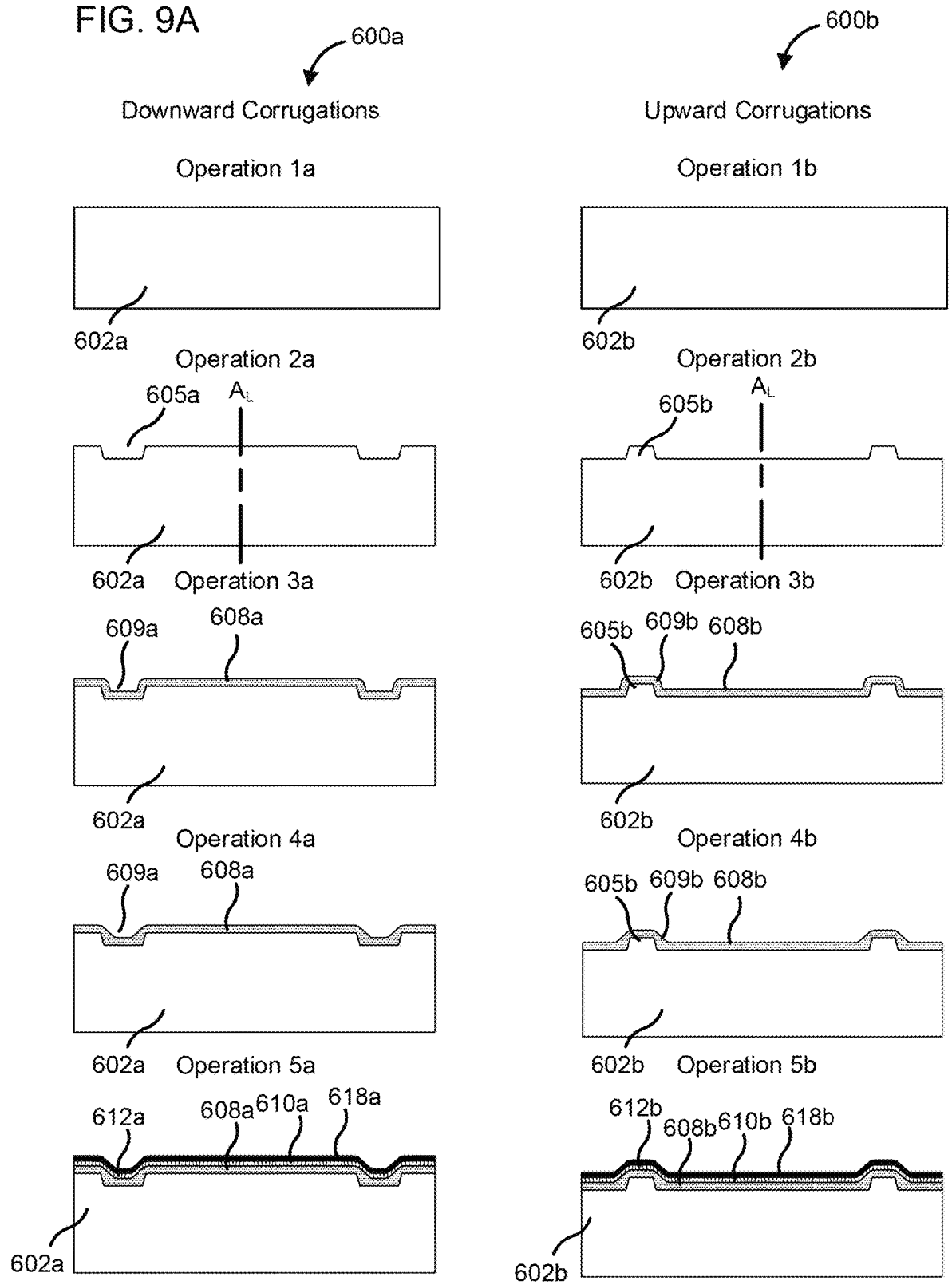
Figure 9B:
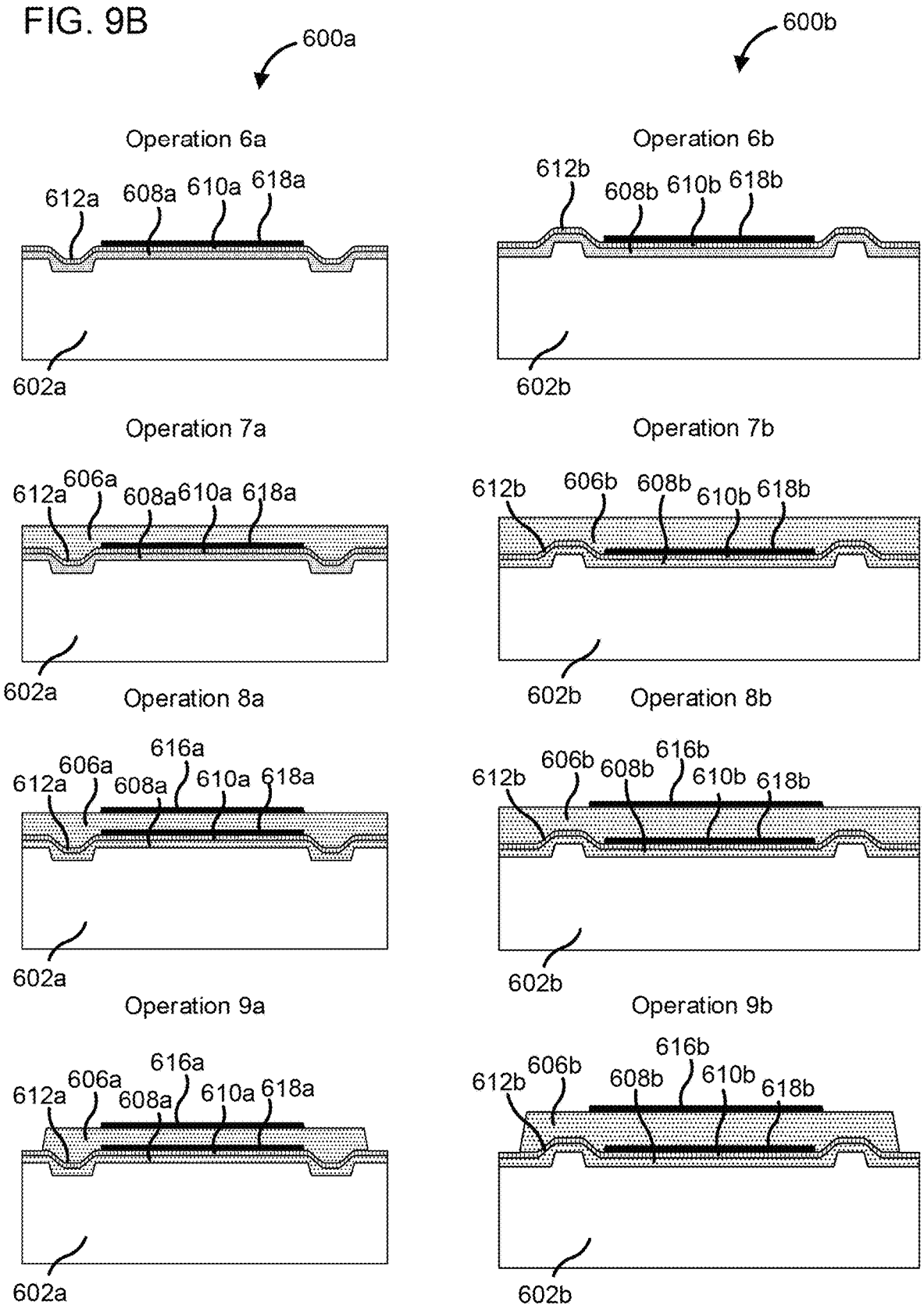

FIGS. 9A-9C illustrate a process flows 600a/b for forming acoustic transducers 60a and 60b having downward and upward facing corrugations, respectively, according to an embodiment. The process 600a/b includes providing a substrate 602a/b (e.g., a glass, Pyrex, quartz, silicon, silicon oxide or any other suitable substrate), at operation 1a/b. At operation 2a, one or more enclosed trenches 605a are etched in the substrate using a wet or dry etch. In contrast, enclosed pillars 605b are formed in the substrate 602b at operation 2b (e.g., using a wet or a dry etch process). The one or more enclosed trenches 605a or pillars 605b may have sharp corners and edges, as previously described herein.

At operation 3a/b a first structural layer 608a/b, for example, a first PSG or BPSG layer having a first impurity content, for example, a first phosphorus content is deposited on the substrate 602a/b. The first structural layer 608a/b may be conformally deposited on the substrate 602a/b such that the first structural layer 608a/b includes depressions 609a and bumps 609b corresponding to the enclosed trenches 605a or the pillars 605b, respectively. Furthermore, the one or more depressions 609a and bumps 609b may have sharp corners and edges corresponding to the sharp corners and edges of the enclosed trenches 605a and the pillars 605b.

At operation 4a/b, the first structural layer 608a/b is heated to a temperature above a glass transition temperature thereof, causing the first structural layer 608a/b to reflow and smooth the corners and edges thereof, as previously described herein. At operation 5a/b, a diaphragm layer 610a/b is deposited on the first structural layer 608a/b, and a first conducting layer 618a/b (e.g., poly layer) is deposited on the diaphragm layer 610a/b. The diaphragm layer 610a/b is conformally deposited on the first structural layer such that the diaphragm layer 610a includes downward facing corrugations 612a corresponding to the depressions 609a formed in the first structural layer 608a, and the diaphragm layer 610b includes upward facing corrugations 612b corresponding to the bumps 609b formed in the first structural layer 608b, the upward and downward facing corrugations 612a/b including smooth or rounded corners and edges.

At operation 6a/b, the first conducting layer 618a/b is selectively etched so as to form an electrical contact on the diaphragm layer 610a/b. At operation 7a/b, a second structural layer 606a/b (e.g., an oxide layer, a second PSG or BPSG layer) is deposited on the diaphragm layer 610a/b and the first conducting layer 618a/b, and planarized (e.g., via chemical-mechanical polishing (CMP)). The second structural layer 606a/b may serve as a spacer to define a gap between the diaphragm layer 610a/b and a back plate layer.

At operation 8a/b, a second conducting layer 616a/b (e.g., a poly layer) is deposited on the second structural layer 606a/b and patterned to define an electrical contact for a back plate layer. At operation 9a/b, the structural layer 606a/b is etched along the edges thereof up to the diaphragm layer 610a/b so as to provide space for sealing a back plate layer to the diaphragm layer 610a/b.

At operation 10a/b, a back plate layer 603a/b (e.g., a LSN layer) is deposited on the second structural layer 606a/b and the second conducting layer 616a/b. The back plate layer 603a/b contacts the diaphragm layer 610a/b at edges of the acoustic transducer 60a/b to seal the acoustic transducer 60a/b. At operation 11a/b, apertures 617a/b are etched through the back plate layer 603a/b and the second conducting layer 616a/b. The apertures 617a/b may have any suitable shape, for example, square, rectangular, circular, oblong, oval, hexagonal, polygonal, any other suitable shape or a combination thereof.

At operation 12a/b, the substrate 602a/b is selectively etched up to the first PSG layer 606a/b to define a channel therein. At operation 13a/b, the first structural layer 608b is etched so as to release the diaphragm layer 610a/b from a first side. A portion of the first structural layer 608a/b disposed on the remaining portion of the substrate 602a/b is left un-etched and may serve as a support structure for the diaphragm layer 610a/b. Furthermore, the second structural layer 606a/b (e.g., a second PSG layer) is etched through the apertures 617a/b so as to release the diaphragm layer 610a/b from a second side opposite the first side, thereby forming the acoustic transducer 60a/b having a diaphragm 610a/b suspended over an opening in the substrate 602a/b. Etching of the structural layer 606a/b also releases the back plate layer 603a/b. A portion of the structural layer 606a/b proximate to corrugations 612a/b at the edges of the diaphragm layer is left un-etched and may facilitate smoothing of the corrugations 612a/b formed in the diaphragm layer 610a/b and/or increase a strength of the diaphragm layer 610a/b.

Figure 10:
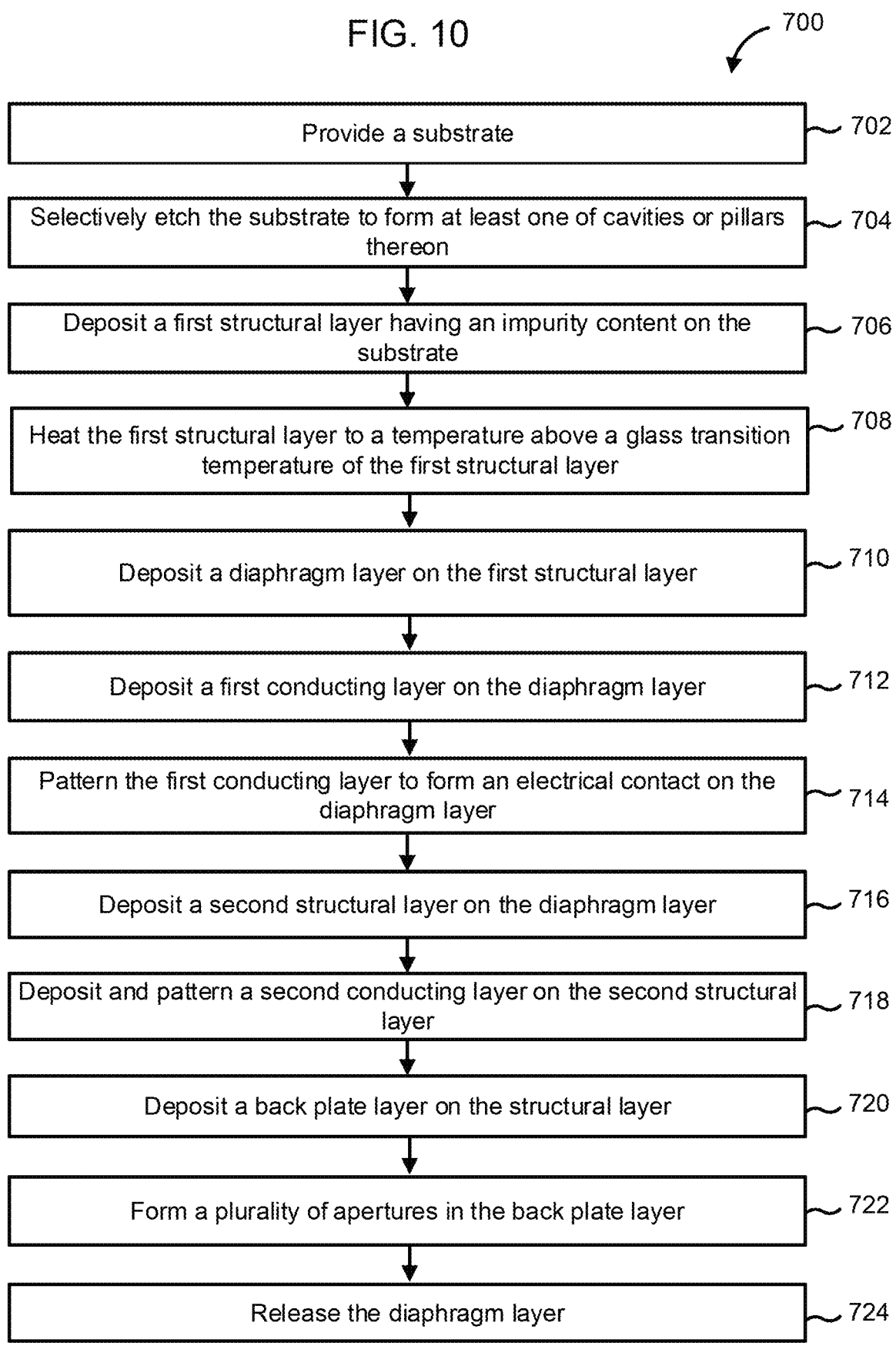
FIG. 10 is a schematic flow diagram of a method for fabricating an acoustic transducer having a diaphragm having an upward or downward facing corrugation defined therein, according to another embodiment.

FIG. 10 is a schematic flow diagram of another method 700 for forming an acoustic transducer (e.g., the acoustic transducer 60) including a diaphragm having upward facing corrugations or downward facing corrugations with smooth corners and edges formed therein, according to an embodiment. The acoustic transducer may include, for example, a MEMS acoustic transducer for use in a MEMS microphone assembly or a MEMS pressure sensor, and may be configured to generate electrical signals in response to acoustic signals or atmospheric pressure changes.

The method 700 includes providing a substrate, at 702. The substrate may be formed from silicon, silicon oxide, glass, Pyrex, quartz, ceramics, or any other suitable material, and may include the substrate 602 described in detail with respect to the process 600. At 704, the substrate is selectively etched to form at least one of one or more enclosed trenches or enclosed pillars on the substrate. For example, the substrate may be etched using a wet etch or dry etch process to define the enclosed trenches or pillars on the substrate. At 706, a first structural layer (e.g., the first PSG layer 608) having a first impurity content is deposited on the substrate. In some embodiments, the first structural layer may include a PSG or BPSG. Furthermore, the impurity may include phosphorus such that a first phosphorus content of the first structural layer may be greater than 2% (e.g., in a range between 2% to 10%). The first structural layer is conformally deposited on the substrate such that the first structural layer includes one or more depressions or bumps defined thereon corresponding to the one or more enclosed trenches or pillars, respectively formed in the substrate.

At 708, the first structural layer is heated to a temperature above a glass transition temperature of the first structural layer causing the first structural layer to reflow. As described previously herein, the cavities or pillars formed in the substrate may have sharp corners and edges (e.g., having a radius of curvature of less than 1 μm) such that the depressions or bumps formed in the first structural layer may have corresponding sharp corners and edges. Reflowing the first structural layer smoothens or rounds the corners and edges of the depressions or bumps formed in the first structural layer such that the corners and edges of the first structural layer may have a radius of curvature greater than 1 μm and less than 50 μm.

At 710, a diaphragm layer (e.g., the diaphragm layer 610) is deposited on the first structural layer such that the diaphragm layer includes at least one of downward facing corrugations corresponding to the depressions or upward facing corrugations corresponding to the bumps formed in the first structural layer. For example, a low stress material, for example LSN or a low stress ceramic may be deposited on the first structural layer (e.g., via a physical or chemical vapor deposition process). In other embodiments, the diaphragm layer may include a dielectric or conductive material (e.g., silicon oxide, silicon nitride, silicon carbide, gold, aluminum, platinum, etc.). Furthermore, the one or more downward facing corrugations or upward facing corrugations defined in the diaphragm layer have corners with radius of curvature corresponding to the second radius of curvature, i.e. radius of curvature after reflowing the first structural layer. In this manner, the stress concentration is reduced at the edges or corners of the corrugations increasing robustness and shock resistance.

In some embodiments, the method 700 also includes depositing a first conducting layer (e.g., the first conducting layer 618) on the diaphragm layer, at 712. In some embodiments, the first conducting layer may be formed from polysilicon (poly). In other embodiments, the first conducting layer may be formed from metals, doped silicon or any other suitable material. At 714, the first conducting layer is patterned so as to form an electrical contact on the diaphragm layer.

In some embodiments, the method 700 also includes depositing a second structural layer which may include, for example, a second PSG or BPSG layer (e.g., the second PSG layer 606) on the diaphragm layer, at 716. The second structural layer may have a second impurity content, e.g., a second phosphorus content in a range between 2% and 10%, which may be the same or different (e.g., higher or lower) than the first phosphorus content included in the first structural layer. In other embodiments, the second structural layer may include an oxide, a nitride or any other suitable layer serving as a gap layer or spacer between the diaphragm layer and a back plate layer. In some embodiments, the second structural layer may be planarized, for example, via a chemical-mechanical planarization (CMP) process.

In some embodiments, a back plate layer (e.g., the back plate layer 603) may be deposited on the second structural layer, at 720. The back plate layer may be formed from a low stress material, for example low stress silicon nitride (LSN), low stress oxide or any other suitable material. The back plate layer may be deposited using PVD, LPCVD, PECVD, ALD, any other suitable process or a combination thereof. The back plate layer may be relatively inflexible relative to a diaphragm to be formed from the diaphragm layer. A plurality of apertures may be formed in the back plate layer, at 722 as previously described with respect to the method 300.

In some embodiments, the method 700 may also include depositing and patterning a second conducting layer (e.g., the second conducting layer 616) before depositing the back plate layer on the structural layer, at 718. In some embodiments, the first conducting layer may be formed from polysilicon (poly). In other embodiments, the first conducting layer may be formed from metals, doped silicon or any other suitable material. The first conducting layer may be deposited using PVD, thermal evaporation, e-beam evaporation, CVD, LPCVD, PECVD, ALD, or any other suitable process or a combination thereof. In other embodiments, the second conducting layer may be deposited on the back plate layer. The second conducting layer contacts the back plate layer and forms an electrical contact therewith. Furthermore, forming the plurality of apertures also forms corresponding apertures through the second conducting layer.

At 724, the diaphragm layer is released, thereby forming a diaphragm suspended over the substrate. In some embodiments, releasing the diaphragm may include etching through each of the substrate and the first structural layer to release the diaphragm from a first side (e.g., a back side of the acoustic transducer). Furthermore, the second structural layer (e.g., a second PSG layer) may be etched through the apertures so as to also release the diaphragm from a second side opposite the first side. The etching may also release the back plate layer so as to form a back plate suspended over the first diaphragm. In particular embodiments, the etching is performed for a predetermined time such that a portion of the second structural layer proximate to the upward facing corrugations or downward facing corrugations of the diaphragm layer is not removed. The portion of the second structural layer may facilitate rounding of the corners and edges of the upward or downward facing corrugations formed in the diaphragm.

In some embodiments, the diaphragm formed using the method 700 may have a compliance which is at least two times more than a compliance of a similar constrained diaphragm that does not include the corrugations. Furthermore, the diaphragm may be able to withstand a pressure differential in between a range of 50 to 70 psi. While not shown, in some embodiments, the method 700 may also include forming a piercing or through-hole through the diaphragm and optionally, the back plate, for example to allow pressure equalization between a front volume and a back volume of the acoustic transducer.

Figure 11B:
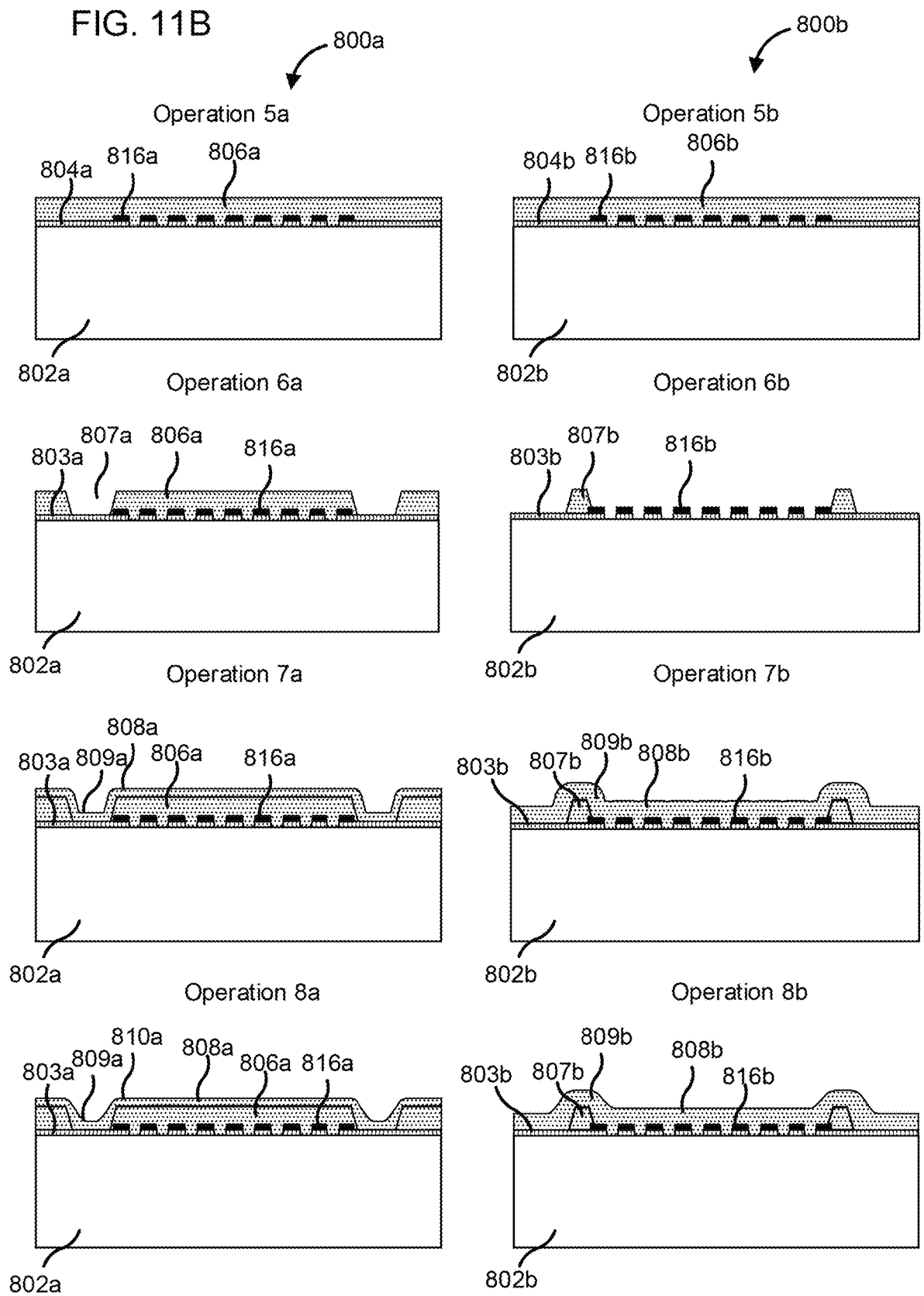
Figure 12B:
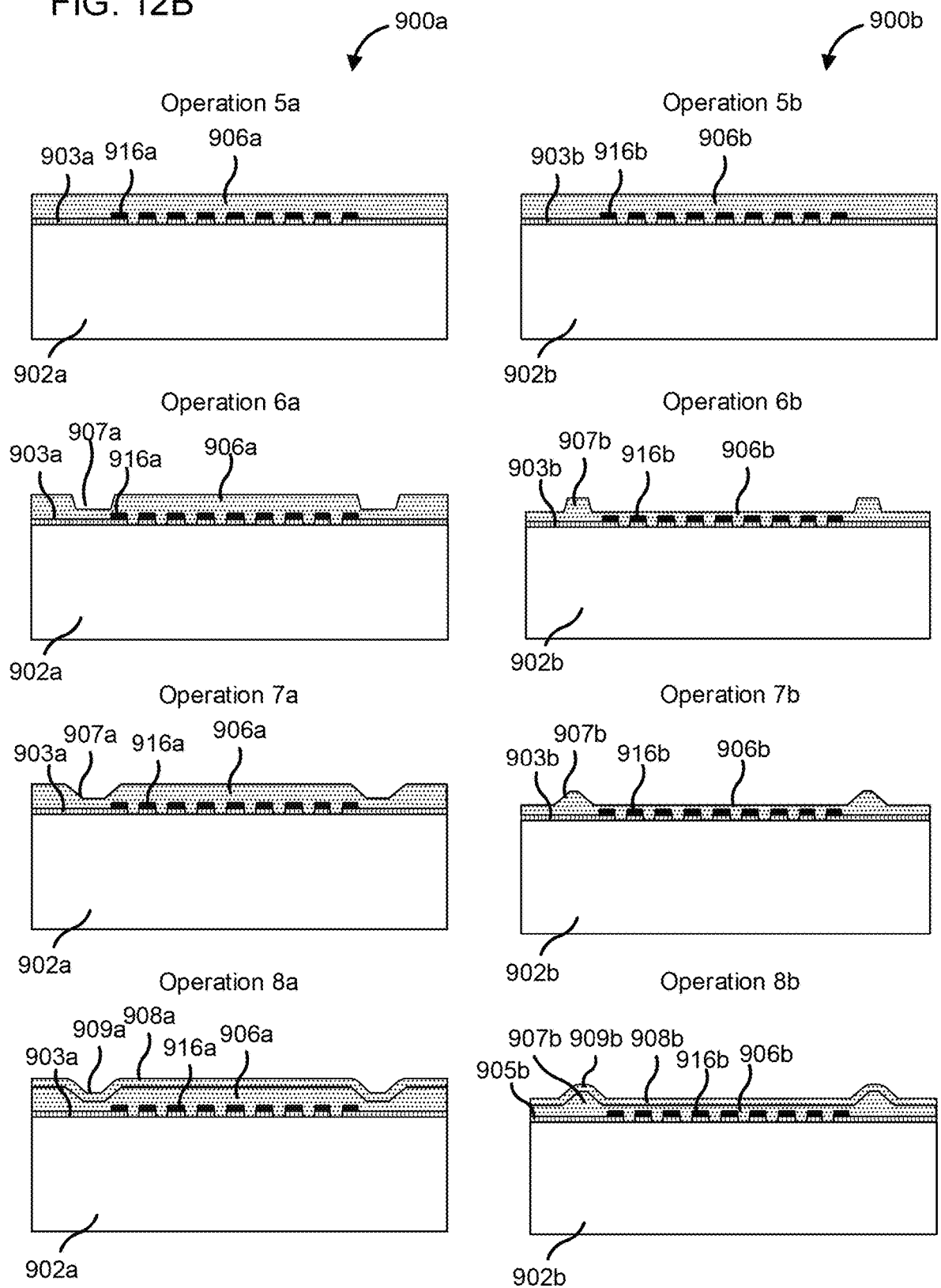
Figure 12C:
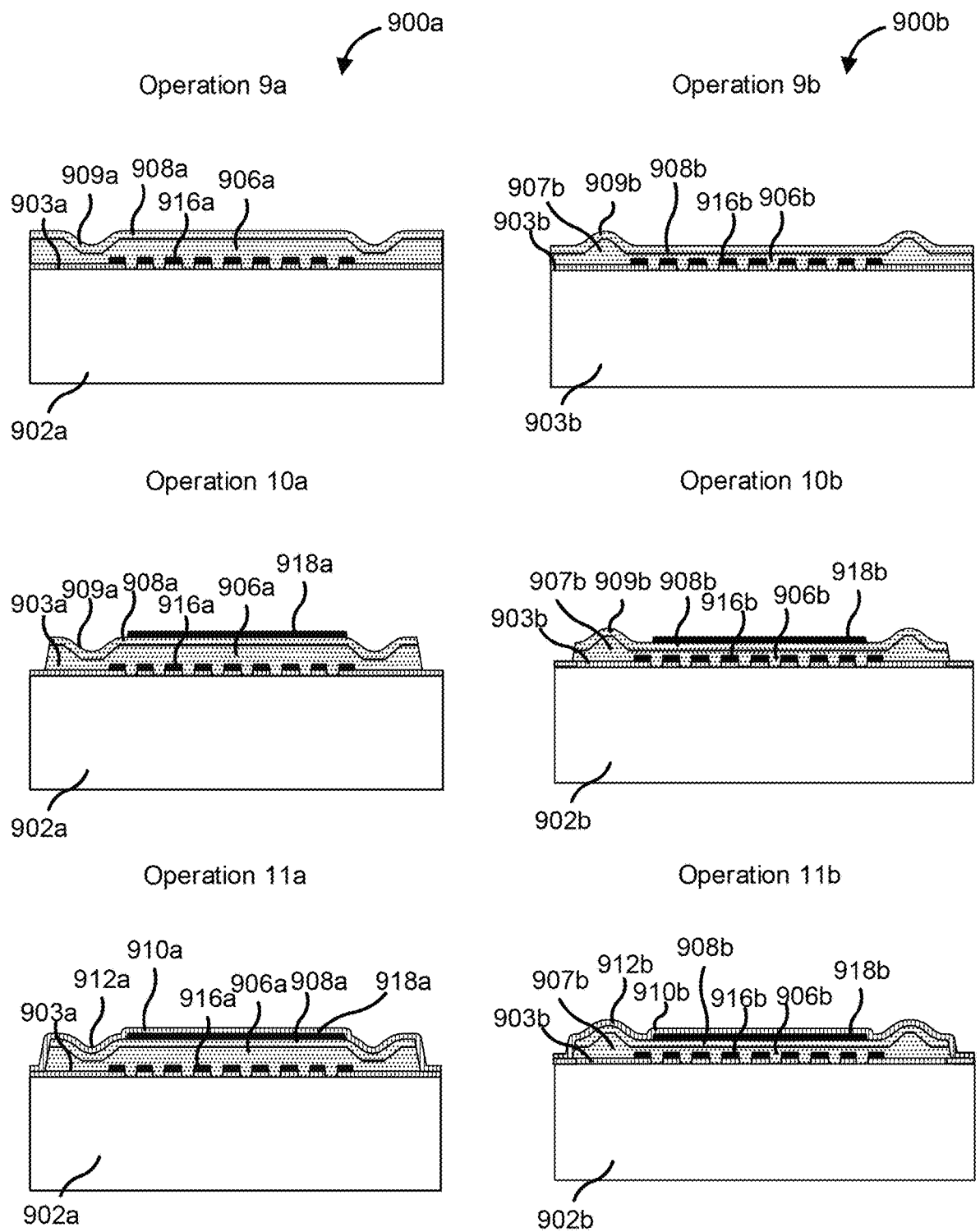
Figure 12D:
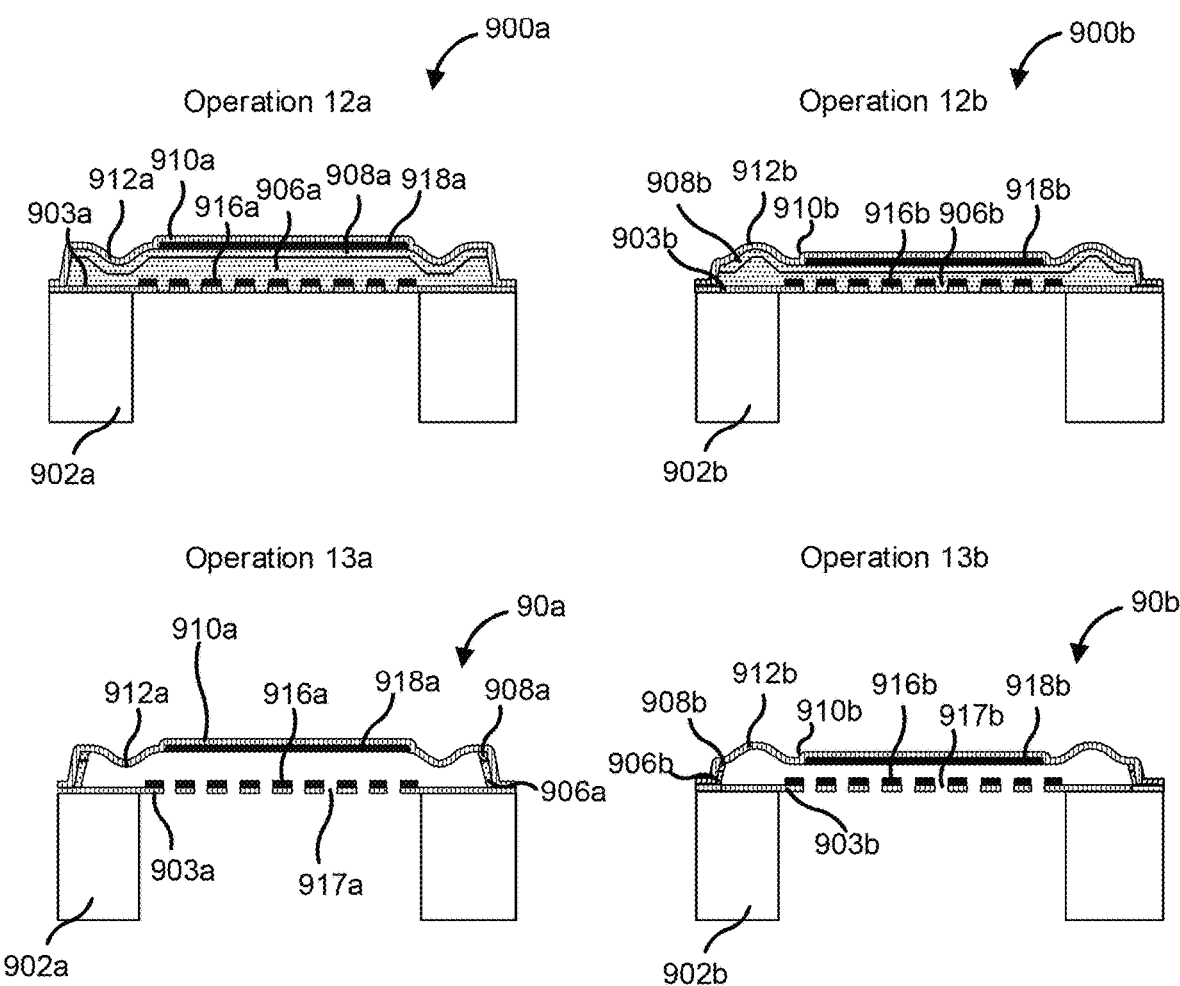
Figure 13C:
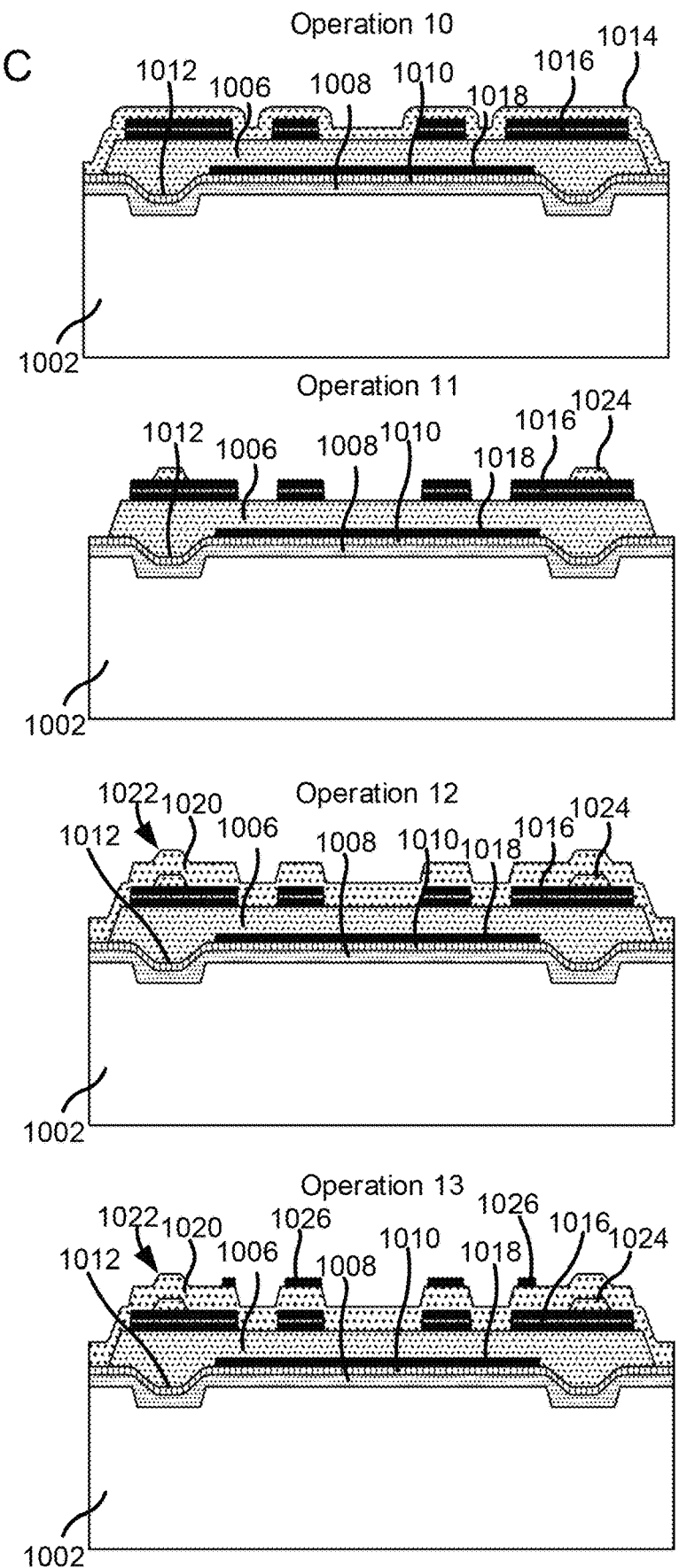

FIGS. 11A-11C illustrate process flows 800a/b for forming acoustic transducers 80a and 80b having downward and upward facing corrugations, respectively, according to an embodiment. The process 800 is substantially similar to the process 500 but includes some differences highlighted herein. The process 800a/b include providing a substrate 802a/b (e.g., a glass, Pyrex, quartz, silicon, silicon oxide or any other suitable substrate), at operation 1a/b.

At operation 2a/b a back plate layer 803a/b is deposited on the substrate 802a/b and a first conducting layer 816a/b is deposited on the back plate layer 803a/b. At operation 3a/b, a plurality of apertures 817a/b are defined in the back plate layer 803a/b and the first conducting layer 816a/b, for example, using a wet or dry etching process. At operation 4a/b, the first conducting layer is selectively etched to form an electrical contact on the back plate layer 803a/b.

At operation 5a/b, a first structural layer 806a/b (e.g., a first PSG or BPSG layer) is deposited on the back plate layer 803a/b. The first structural layer 806a/b may be planarized (e.g., via CMP) after deposition on the back plate layer 803a/b. The first structural layer 806a/b may have a first impurity content, for example, a first phosphorus content in a range between 2% and 10%. At operation 6a one or more enclosed trenches 807a are etched in the first structural layer 806a, on operation 6b the first structural layer 806b is etched so as to form enclosed pillars 807b from the first structural layer 806b, as previously described herein with respect to FIGS. 4A-4C. In particular embodiments, a wet etch process may be used etch the first structural layer 806a/b up to the back plate layer 803a/b disposed therebeneath, the back plate layer 803a/b serving as an etch stop for the wet etch.

At operation 7a/b, a second structural layer 808a/b, for example, a second PSG or BPSG layer is deposited on the first structural layer 806a/b and the open areas of the back plate layer 803a/b. Unlike the process 400 shown in FIGS. 4A-4C, the second structural layer 808a/b has the same impurity content, for example, the same phosphorus content as the first structural layer 806a/b (e.g., in a range between 2% and 10%). The second structural layer 808a/b is conformally deposited on the first structural layer 806a/b so as to include one or more depressions 809a corresponding to the one or more enclosed trenches 807a formed in the first structural layer 806a, or one or more bumps 809b corresponding to the one or more enclosed pillars 807b formed from the first structural layer 806b. The cavities 809a or the pillars 809b may have corners which are rounder than the corners of the cavities 807a or pillars 807b of the underlying first structural layer 806a/b.

At operation 8a/b, the second structural layer 808a/b is heated to a temperature above a glass transition temperature of the second structural layer 808a/b and thereby, also the first structural layer 806a causing the second structural layer 808a/b and, in some implementations, also the first structural layer 806a to reflow. Reflowing further smooths or rounds the sharp edges and corners of depressions 809a and the bumps 809b formed in the second structural layer 808a/b.

At operation 9a/b a second conducting layer 818a/b (e.g., a poly layer) is deposited on the second structural layer 808a/b and patterned. At operation 10a/b, each of the second structural layer 808a/b and the first structural layer 806a are etched along the edges of each layers up to the back plate layer 803a/b so as to provide space for sealing a diaphragm layer 810a/b to the back plate layer 803a/b.

At operation 11a/b, the diaphragm layer 810a/b (e.g., a LSN layer) is deposited on the second structural layer 808a/b such that the diaphragm layer 810a includes one or more downward facing corrugations 812a corresponding to the one or more depressions 809a formed in the second structural layer 808a, or one or more upward facing corrugations 812b corresponding to the one or more bumps 809b formed in the second structural layer 808b. Furthermore, the diaphragm layer 810a/b contacts the back plate layer 803a/b so as to seal the edges of the acoustic transducer 80a/b. At operation 12a/b, a portion of the substrate 802a/b, and a bulk of the first structural layer 806a and the second structural layer 808a/b are etched (e.g., through the apertures 817a/b defined in the back plate layer 803a/b) so as to release the diaphragm layer 810a/b as well as the back plate layer 803a/b, thereby forming a diaphragm and back plate of the acoustic transducer 80a/b.

A small portion of the structural layers 806a and 808a/b are left un-etched near a perimeter or edge of the diaphragm layer, as shown in operations 12a/b to provide a perimetral support structure. Using structural layers 806a and 808a/b having the same impurity content may allow the etching to proceed at the same rate for each of the structural layers 806a and 808a/b and may yield a tapered profile for the remaining portion of the structural layers 806a and 808a/b. This is because etching of the structural layers 806a and 808a/b initiates from the apertures 817a/b defined in the back plate 803a/b and occurs isotropically. Therefore, the portions of the structural layers 806a and 808a/b farthest from the apertures 817a/b etch last. The remaining portion of the structural layers 806a and 808a/b may slope inwardly from the back plate layer 803a/b towards the diaphragm layer 810a/b and may serve to increase a strength of diaphragm layer 810a/b and/or facilitate rounding of the corrugations 812a/b.

FIGS. 12A-12D illustrate process flows 900a/b for forming acoustic transducers 90a and 90b having downward and upward facing corrugations, respectively, according to an embodiment. The process 900a/b is substantially similar to the process 500a/b with some differences highlighted herein.

The process 900a/b include providing a substrate 902a/b (e.g., a glass, Pyrex, quartz, silicon, silicon oxide or any other suitable substrate), at operation 1a/b. At operation 2a/b, a back plate layer 903a/b is deposited on the substrate 902a/b and a first conducting layer 916a/b is deposited on the back plate layer 903a/b. At operation 3a/b, a plurality of apertures 917a/b are defined in the back plate layer 903a/b and the first conducting layer 916a/b, for example, using a wet or dry etching process.

At operation 4a/b, the first conducting layer 916a/b is selectively etched to form an electrical contact on the back plate layer 903a/b. At operation 5a/b, a first structural layer 906a/b, for example, a first PSG or BPSG layer is deposited on the substrate 902a/b. The first PSG layer 906a/b may have a first impurity content, for example, a first phosphorus content, in a range between 2% and 10%. In some embodiment, the first structural layer 906a/b may be planarized (e.g., via CMP) after deposition on the back plate layer 903a/b.

At operation 6a, one or more enclosed trenches 907a are formed in the first structural layer 906a, or, the first structural layer 906b is etched so as to form one or more enclosed pillars 907b. In particular embodiments, the first structural layer 906a/b is etched using a timed dry etch process such that the dry etch does not reach the back plate layer 903a/b and portions of the first structural layer 906a/b remain disposed on the entire back plate layer 903a/b.

At operation 7a/b, the first structural layer 906a/b is heated to a temperature above a glass transition temperature thereof so as to cause the first structural layer 906a/b to reflow and smoothen the edges or corners of the enclosed trenches 907a or pillars 907b defined in the first structural layer 906a and 906b, respectively. At operation 8a/b a second structural layer 908a/b, for example, a second PSG or BPSG layer, is deposited over the first structural layer 906a/b, such that the second structural layer 908a/b includes depressions 909a or bumps 909b corresponding to the enclosed trenches 907a or pillars 907b, respectively defined in the first structural layer 906a/b. Edges or corners of the depressions 909a or bumps 909b may be smoother or rounder than the corresponding enclosed trenches 907a and pillars 907b. Different from process 500a/b, the second structural layer 908a/b may have a second impurity content, for example, a second phosphorus content, equal to the first impurity content (e.g., in a range between 2% and 10%). For example, the second structural layer 908a/b may include the same materials as the first structural layer 906a/b At operation 9a/b the second structural layer 908a/b is heated to a temperature above the glass transition temperature thereof, so as to cause the second structural layer 908a/b, and in some implementations, also the first structural layer to reflow, further rounding the corners of the depressions 909a and bumps 909b. At operation 10a/b, a second conducting layer 918a/b is deposited and patterned on the second structural layer 908a/b. Also shown in operation 10a/b, each of the second structural layer 908a/b and the first structural layer 906a/b are etched along the edges of each layers up to the back plate layer 903a/b so as to provide space for sealing a diaphragm layer 910a/b to the back plate layer 903a/b.

At operation 11a/b, the diaphragm layer 910a/b (e.g., a LSN layer) is deposited on the second structural layer 908a/b such that the diaphragm layer 910a includes one or more downward facing corrugations 912a corresponding to the one or more depressions 909a formed in the second structural layer 908a, or one or more upward facing corrugations 912b corresponding to the one or more bumps 909b formed in the second structural layer 908b. Furthermore, the diaphragm layer 910a/b contacts the back plate layer 903a/b at radial edges thereof, so as to seal the edges of the acoustic transducer 90a/b. At operation 12a/b, a portion of the substrate 902a/b is etched, and at operation 13a/b, a bulk of the first structural layer 906a/b and the second structural layer 908a/b is etched (e.g., through the apertures 917a/b defined in the back plate layer 903a/b) so as to release the diaphragm layer 910a/b as well as the back plate layer 903a/b, thereby forming a diaphragm and back plate of the acoustic transducer 90a/b. A small portion of the structural layers 906a/b and 908a/b are left un-etched near perimeter or edge of the diaphragm layer, as shown in operations 13a/b to from a perimetral support structure. The remaining portion of the structural layers 906a/b and 908a/b may taper inwardly from the back plate layer 903a/b towards the diaphragm layer 910a/b and may serve to increase a strength of diaphragm layer 910a/b and/or facilitate rounding of the corrugations 912a/b.

FIGS. 13A-13E illustrate a process flow 1000 for forming an acoustic transducer having downward and upward facing corrugations, according to an embodiment. In particular, the process flow 1000 can be utilized to form a dual diaphragm acoustic transducer 100 (shown in FIG. 13E) including downward and upward corrugations. The process 1000 includes providing a substrate 1002 (e.g., a glass, Pyrex, quartz, silicon, silicon oxide or any other suitable substrate), at operation 1. At operation 2, one or more enclosed trenches 1005 are etched in the substrate using a wet or dry etch. The one or more enclosed trenches 1005 may have sharp corners and edges, as previously described herein.

At operation 3, a first structural layer 1008, for example, a first PSG or BPSG layer having a first impurity content, for example, a first phosphorous content is deposited on the substrate 1002. The first structural layer 1008 may be conformally deposited on the substrate 1002 such that the first structural layer 1008 includes depressions 1009 corresponding to the enclosed trenches 1005. Furthermore, the one or more depressions 1009 may have sharp corners and edges corresponding to sharp corners and edges of the enclosed trenches 1005.

At operation 4, the first structural layer 1008 is heated to a temperature above a glass transition temperature thereof, causing the first structural layer 1008 to reflow and smooth the corners and edges thereof, as previously described herein. At operation 5, a first diaphragm layer 1010 is deposited on the first structural layer 1008, and a first conducting layer 1018 (e.g., poly layer) is deposited on the first diaphragm layer 1010. The first diaphragm layer 1010 is conformally deposited on the first structural layer such that the first diaphragm layer 1010 includes downward facing corrugations 1012 corresponding to the depressions 1009 formed in the first structural layer 1008. The downward facing corrugations 1012 can include smooth or rounded corners and edges.

At operation 6, the first conducting layer 1018 is selectively etched so as to form an electrical contact on the first diaphragm layer 1010. At operation 7, a second structural layer 1006 (e.g., an oxide layer, a second PSG or BPSG layer) is deposited on the first diaphragm layer 1010 and the first conducting layer 1018, and planarized (e.g., via chemical-mechanical polishing (CMP)). The second structural layer 1006 may serve as a spacer to define a gap between the diaphragm layer 1010 and a back plate layer.

At operation 8, the second structural layer 1006 is etched along the edges thereof up to first diaphragm layer 1010 so as to provide space for a sealing a back plate layer to the first diaphragm layer 1010. At operation 9, a back plate layer 1016 is deposited and patterned on the second structural layer 1006. The back plate layer 1016 can include one or more layers of poly and silicon nitride. For example, the back plate layer 1016 can include a silicon nitride layer between two poly layers. The back plate layer 1016 is patterned to form back plate apertures that can allow posts in a second diaphragm to pass through (discussed further below).

At operation 10, a third structural layer 1014 is deposited over the back plate layer 1016. In some embodiments, the third structural layer 1014 can be similar in composition to the first and the second structural layers 1008 and 1006 discussed above. At operation 11, the third structural layer 1014 is patterned to form pillars 1024, which aid in forming corrugations in a second diaphragm, discussed further below. At operation 12, a fourth structural layer 1020 for supporting the second diaphragm is deposited and may form a portion of a peripheral support structure. In some embodiments, the fourth structural layer 1020 can include one or more layers. For example, the fourth structural layer 1020 can include multiple layers of PSG or BPSG with different concentration levels. As an example the fourth structural layer 1020 can include two sub-layers of PSG or BPSG, a first with a concentration of 5%-9% and another with a concentration of 2.5%-6.5%. In some embodiments, the sub-layers can be deposited over one another with increasing concentrations. In some embodiments, a middle sub-layer can be sandwiched between two sub-layers having concentrations that are less than that of the middle layer. The fourth structural layer 1020 can be conformally deposited over the pillars 1024 formed using the third structural layer 1014, resulting in fourth structural layer pillars 1022. At least a portion of the fourth structural layer 1020 makes contact with the back plate layer At operation 13, a second conducting layer 1026 is deposited and patterned over the fourth structural layer 1020. The second conducting layer 1026 can be of similar material to the first conducting layer 1018, and can be patterned in some portions to form apertures therethrough. At least some apertures in the second conducting layer 1026 can be aligned with apertures in the back plate layer 1016. At operation 14, the fourth structural layer 1020, the second structural layer 1006 are patterned to expose the first conducting layer 1018 or first diaphragm layer 1010. In particular, the fourth and the second structural layers 1020 and 1006 can be etched primarily in regions that do not have the second conducting layer 1026 deposited over the fourth structural layer 1020 and the back plate layer 1016 deposited over the second structural layer 1006, and that lie above the first conductive layer 1018. However, the portions of the fourth structural layer 1020 forming the fourth structural layer pillars 1022 are retained. The etching of the fourth structural layer 1020 and the second structural layer 1006 can form one or more cavities 1028 that are defined, at least in part, by the apertures in the back plate layer 1016 and the apertures in the second conducting layer 1026. As discussed further below, the cavities 1028 can be used to form posts of the second diaphragm.

At operation 15, a spacer layer 1030 can be deposited and patterned subsequent to the patterning of the fourth structural layer 1020 and the second structural layer 1006 to from the cavities 1028. The spacer layer 1030 can be formed using silicon oxide, and can be deposited conformally over the fourth structural layer 1020, the second conducting layer 1026, the exposed portions of the first conducting layer 1018 within the cavities 1028, and the fourth structural layer pillars 1022. The spacer layer 1030 can be patterned to form apertures 1032 that expose portions of the underlying second conducting layer 1026 and the first conducting layer 1018. The spacer layer 1030 can allow the formation of a gap between portions of posts of the second diaphragm and the first conducting layer 1018 of the first diaphragm layer 1008. The thickness of the spacer layer can be based on the desired magnitude of the gap. In some embodiments, where no gap is desired the spacer layer 1030 may not be deposited.

At operation 16, a second diaphragm layer 1034 is deposited over the spacer layer 1030, or if the spacer layer 1030 is not utilized, conformally over the fourth structural layer 1020, the second conducting layer 1026, the exposed portions of the first conducting layer 1018 within the cavities 1028, and the fourth structural layer pillars 1022. The second diaphragm layer 1034 can be similar to the first diaphragm layer 1010. However, unlike the first diaphragm layer 1010, which includes downward facing corrugations 1012, the second diaphragm 1034 can include upward facing corrugations 1038 formed over the fourth structural layer pillars 1022. The second diaphragm 1034 also may form at least one anchor post 1040 and at least two posts 1042 spaced apart from the anchor post 1040. The anchor post 1040 includes an apex 1044 formed at the bottom of the cavity 1028 (operation 15) and makes contact with and is coupled to the first conducting layer 1018. The portions of the second diaphragm 1034 between the anchored post 1040 and the at least two posts 1042 make contact with and are coupled to the second conducting layer 1026. The second diaphragm layer 1034 can be patterned to form a plurality of openings 1036 that can expose the underlying spacer layer 1030 or, in instances where no spacer layer 1030 is used, the underlying fourth structural layer 1020.

At operation 17, a portion of the apex 1044 (of the anchor post 1040) of the second diaphragm 1034, a portion of the first conducting layer 1018 under the apex 1044, and a portion of the first diaphragm layer 1008 under the apex 1044 are patterned to form a pierce or a through hole 1046. The through hole 1046 can allow pressure equalization between a front volume and a back volume of the acoustic transducer.

At operation 18, portions of the second structural layer 1006 (between the first diaphragm 1010 and the back plate 1016), portions of the fourth structural layer 1020 (between the back plate 1016 and the second diaphragm 1034), and the third structural layer 1014 (e.g., pillars 1024) are removed by an etchant. For example, an isotropic etchant (e.g., a wet etchant such as buffered hydrofluoric acid) can be allowed to flow through the openings 1036 formed in the second diaphragm 1034. Removing portions of the fourth structural layer 1020 and the second structural layer 1006 result in internal cavities 1048 defined by the second diaphragm 1034 and the first diaphragm 1010. However, the etching process can be controlled such that not all of the second structural layer 1006 and the fourth structural layer 1020 is removed. Instead, a peripheral support structure 1038 between the peripheries of the first diaphragm layer 1010 and the second diaphragm layer 1034 is retained. The peripheral support structure 1038 is positioned proximate to corrugations 1012 and 1038 and can increase the strength of the first diaphragm layer 1010 and the second diaphragm layer 1034.

In some embodiments, the second structural layer 1006 and the fourth structural layer 1020 can have different concentrations of impurities, such as phosphorous or boron. For example, in some embodiments, the second structural layer 1006 can have a concentration of phosphorous between 2% and 6%, and the fourth structural layer 1020 can have a concentration of phosphorous between 4% and 10%. Varying the concentration of phosphorous, or other impurities, can allow a non-uniform etching of the second structural layer 1006 in relation of the fourth structural layer 1020, resulting in a formation of a tapered peripheral support structure 1038, which can improve the strength of the first and the second diaphragms 1010 and 1034.

At operation 19, a portion of the substrate 1002 and a bulk of the first structural layer 1008 are etched so as to release the first diaphragm layer 1010, and to form the acoustic transducer 100.

In some embodiments, a method of forming an acoustic transducer comprises providing a substrate, and depositing a first structural layer on the substrate. The first structural layer is selectively etched to form at least one of an enclosed trench or an enclosed pillar on the structural layer. A second structural layer is deposited on the structural layer. The second structural layer includes a depression or a bump corresponding to the enclosed trench or the enclosed pillar, respectively formed in the first structural layer. At least the second structural layer is heated to a temperature above a glass transition temperature of the second structural layer causing the second structural layer to reflow. A diaphragm layer is deposited on the second structural layer such that the diaphragm layer includes at least one of a downward facing corrugation corresponding to the depression or an upward facing corrugation corresponding to the bump formed in the second structural layer. The diaphragm layer is released, thereby forming a diaphragm suspended over the substrate.

In some embodiments, a method of forming an acoustic transducer comprises providing a substrate and selectively etching the substrate to form at least one of an enclosed trenches or an enclosed pillar on the substrate. A first structural layer is deposited on the substrate. The first structural layer includes at least one of a depression or a bump corresponding to the enclosed trenches or the enclosed pillar, respectively formed in the substrate. The first structural layer is heated to a temperature above a glass transition temperature of the first structural layer causing the first structural layer to reflow. A diaphragm layer is deposited on the first structural layer such that the diaphragm layer includes at least one of a downward facing corrugation corresponding to the depression or an upward facing corrugation corresponding to the bump formed in the first structural layer. The diaphragm layer is released, thereby forming a diaphragm suspended over the substrate.

In some embodiments, an acoustic transducer is formed by the process of providing a substrate, and depositing a first structural layer on the substrate. The first structural layer is selectively etched to form at least one of an enclosed trench or an enclosed pillar on the structural layer. A second structural layer is deposited on the structural layer. The second structural layer includes a depression or a bump corresponding to the enclosed trench or the enclosed pillar, respectively formed in the first structural layer. At least the second structural layer is heated to a temperature above a glass transition temperature of the second structural layer causing the second structural layer to reflow. A diaphragm layer is deposited on the second structural layer such that the diaphragm layer includes at least one of a downward facing corrugation corresponding to the depression or an upward facing corrugation corresponding to the bump formed in the second structural layer. The diaphragm layer is released, thereby forming a diaphragm suspended over the substrate.

In some embodiments, a method can include providing a substrate; depositing a first structural layer on the substrate; selectively etching the first structural layer to form at least one of an enclosed trench or enclosed pillar on the first structural layer; depositing a second structural layer on the first structural layer, the second structural layer including at least one of a depression or a bump corresponding to the at least one of the enclosed trench or the enclosed pillar formed in the first structural layer; heating at least the second structural layer to a temperature above a glass transition temperature of the second structural layer causing the second structural layer to reflow; depositing a diaphragm layer on the second structural layer such that the diaphragm layer includes at least one of a downward facing corrugation corresponding to the depression or an upward facing corrugation corresponding to the bump formed in the second structural layer; and releasing the diaphragm layer, thereby forming a diaphragm suspended over the substrate.

In some embodiments, at least one of the first structural layer or the second structural has an impurity content. In some embodiments, at least one of the first structural layer and the second structural layer comprises phosphosilicate glass (PSG) or borophosphosilicate glass (BPSG), and wherein an impurity content in at least one of the first structural layer or the second structural layer comprises phosphorus. In some embodiments, the first structural layer is a first PSG layer having a first phosphorus content, and the second structural layer is a second PSG layer having a second phosphorus content different from the first phosphorus content. In some embodiments, the first structural layer is a first PSG layer having a first phosphorus content, and the second structural layer is a second PSG layer having a second phosphorus content being equal to the first phosphorus content. In some embodiments, the second phosphorus content is greater than 2%. In some embodiments, the first phosphorus content is between 4% and 10% and the second phosphorus content is between 2% and 6%, the first phosphorus content being greater than the second phosphorus content. In some embodiments, the first phosphorus content is between 2% and 6%, and the second phosphorus content is between 4% and 10%, the second phosphorus content being greater than the first phosphorus content.

In some embodiments, the temperature during heating is greater than a glass transition temperature of the second PSG layer but lower than a glass transition temperature of the first PSG layer. In some embodiments, the temperature during heating is greater than a glass transition temperature of each of the first PSG layer and the second PSG layer. In some embodiments, the method further comprises before depositing the second PSG layer, heating the first PSG layer above a glass transition temperature of the first PSG layer so as to cause the first PSG layer to reflow. In some embodiments, the depression or the bump formed in the second structural layer prior to heating the second structural layer includes edges having a first radius of curvature of less than 1 mm, and wherein the depression or the bump, after heating the structural layer, includes edges having a second radius of curvature of greater than 1 µm and less than 50 µm such that each of the downward facing corrugations or the upward facing corrugation defined in the diaphragm layer has a radius of curvature corresponding to the second radius of curvature. In some embodiments, releasing the diaphragm comprises etching through each of the substrate, the first structural layer and the second structural layer; and wherein etching of the first structural layer and the second structural layer is performed such that a portion of the first structural layer and a portion of the second structural layer proximate to a perimetral edge of the diaphragm layer is not removed.

In some embodiments, the portion of the second structural layer contacts the diaphragm layer, and wherein an inner radial edge of the portion of the second structural layer proximate to the diaphragm is positioned radially closer to the downward facing corrugation or upward facing corrugation defined in the diaphragm layer relative to an inner radial edge of the portion of the first structural layer proximate to the substrate. In some embodiments, the method further comprises before depositing the first structural layer, depositing a back plate layer on the substrate; depositing a first conducting layer on the back plate layer; forming apertures through the back plate layer and the first conducting layer; and selectively etching the first conducting layer so as to form an electrical contact on the back plate layer; wherein the first structural layer is deposited on the first conducting layer, and wherein releasing the diaphragm layer also releases the back plate layer, thereby forming a back plate suspended on the substrate below the diaphragm.

In some embodiments, the first structural layer is selectively etched up to the back plate layer. In some embodiments, the first structural layer is selectively etched such that the etch process is stopped before reaching the back plate layer. In some embodiments, the method further comprises: before depositing a diaphragm layer on the second structural layer, depositing and patterning a second conducting layer on the second structural layer, wherein at least a portion of the diaphragm layer contacts the second conducting layer. In some embodiments, the method further comprising planarizing the first structural layer after depositing the first structural layer over the back plate layer and prior to selectively etching the first structural layer. In some embodiments, the method further comprises before releasing the diaphragm layer, depositing a third structural layer on the diaphragm layer; depositing a back plate layer on the third structural layer; and forming a plurality of apertures in the back plate layer, wherein releasing the diaphragm also releases the back plate layer, thereby forming a back plate suspended on the substrate above the diaphragm.

In some embodiments, an acoustic transducer can be formed by the process of providing a substrate. The process can further include depositing a first structural layer on the substrate. The process can also include selectively etching the first structural layer to form at least one of an enclosed trench or enclosed pillar on the first structural layer. The process can further include depositing a second structural layer on the first structural layer, the second structural layer including at least one of a depression or a bump corresponding to the at least one of the enclosed trench or the enclosed pillar formed in the first structural layer. The process can also include heating the second structural layer to a temperature above a glass transition temperature of the second structural layer causing the second structural layer to reflow. The process can further include depositing a diaphragm layer on the second structural layer such that the diaphragm layer includes at least one of a downward facing corrugation corresponding to the depression or an upward facing corrugation corresponding to the bump formed in the second structural layer. The process can also include releasing the diaphragm layer, thereby forming a diaphragm suspended over the substrate.

In some embodiments, at least one of the first structural layer or the second structural has an impurity content. In some embodiments, at least one of the first structural layer and the second structural layer comprises phosphosilicate glass (PSG) or borophosphosilicate glass (BPSG), and wherein the impurity comprises phosphorus. In some embodiments, the first structural layer is a first PSG layer having a first phosphorus content, and the second structural layer is a second PSG layer having a second phosphorus content different from the first phosphorus content. In some embodiments, the temperature during heating is higher than a glass transition temperature of the second PSG layer but lower than a glass transition temperature of the first PSG layer. In some embodiments, the temperature during heating is greater than a glass transition temperature of each of the first PSG layer and the second PSG layer. In some embodiments, the first structural layer is a first PSG layer having a first phosphorus content, and the second structural layer is a second PSG layer having a second phosphorus content being equal to the first phosphorus content. In some embodiments, the process further comprises, before depositing the second PSG layer, heating the first PSG layer above a glass transition temperature of the first PSG layer so as to cause the first PSG layer to reflow.

In some embodiments, the depression or the bump formed in the second structural layer includes edges having a first radius of curvature of less than 1 mm, and wherein reflowing the second structural layer causes the corners to have a second radius of curvature of greater than 1 μm and less than 50 μm such that each of the downward facing corrugations or the upward facing corrugation defined in the diaphragm layer has a radius of curvature corresponding to the second radius of curvature. In some embodiments, the process further comprises before depositing the first structural layer, depositing a back plate layer on the substrate. The process further comprises depositing a first conducting layer on the back plate layer. The process further comprises forming apertures through the back plate layer and the first conducting layer, and selectively etching the first conducting layer so as to form an electrical contact on the back plate layer. In some embodiments, releasing the diaphragm layer also releases the back plate layer, thereby forming a back plate suspended on the substrate below the diaphragm.

In some embodiments, the process further comprises before depositing a diaphragm layer on the second structural layer, depositing and patterning a second conducting layer on the second structural layer, where at least a portion of the diaphragm layer contacts the second conducting layer, the second conducting layer forming an electrical contact with the diaphragm layer.

In some embodiments, a method can include providing a substrate; selectively etching the substrate to form an enclosed trench on the substrate; depositing a first structural layer on the substrate, the first structural layer including a depression corresponding to the enclosed trench formed on the substrate; depositing a first diaphragm layer on the first structural layer such that the first diaphragm layer includes a downward facing corrugation corresponding to the depression; depositing a second structural layer over the first diaphragm layer; depositing a back plate layer over the second structural layer; depositing a third structural layer over the back plate, the third structural layer including an enclosed pillar; depositing a second diaphragm layer over the third structural layer such that the second diaphragm layer includes an upward facing corrugation corresponding to the enclosed pillar in the third structural layer; and releasing the first diaphragm layer and the second diaphragm layer.

In some embodiments, the method further comprises depositing the back plate layer over the second structural layer, the back plate layer including at least one aperture; selectively etching the third structural layer and the second structural layer to form at least one cavity that extends through the at least one aperture; and depositing the second diaphragm layer over the third structural layer such that the second diaphragm includes at least one post corresponding to the at least one cavity, the at least one post being coupled to the first diaphragm layer.

In some embodiments, the method further comprises forming a through hole through the second diaphragm layer and the first diaphragm layer at a portion of the at least one post. In some embodiments, the method further comprises etching at least a portion of the first structural layer and the second structural layer to form at least one internal cavity defined in part by the first diaphragm layer and the second diaphragm layer. In some embodiments, the method further comprises etching at least a portion of the first structural layer and the second structural layer to form a peripheral support structure positioned between the first diaphragm layer and the second diaphragm layer, and wherein the peripheral support structure is positioned along a periphery of the first diaphragm layer.

In some embodiments, at least one of the second structural layer and the third structural layer has an impurity content. In some embodiments, at least one of the second structural layer and the third structural layer comprises phosphosilicate glass (PSG) or borophosphosilicate glass (BPSG), and wherein the impurity content comprises phosphorus. In some embodiments, the second structural layer is a first PSG layer having a first phosphorus content, and the third structural layer is a second PSG layer having a second phosphorus content different from the first phosphorus content. In some embodiments, the first phosphorus content is between 2% and 6%, and the second phosphorus content is between 4% and 10%, the second phosphorus content being greater than the first phosphorus content.

In some embodiments, an acoustic transducer can be formed by the process of providing a substrate; selectively etching the substrate to form an enclosed trench on the substrate; depositing a first structural layer on the substrate, the first structural layer including a depression corresponding to the enclosed trench formed on the substrate; depositing a first diaphragm layer on the first structural layer such that the first diaphragm layer includes a downward facing corrugation corresponding to the depression; depositing a second structural layer over the first diaphragm layer; depositing a back plate layer over the second structural layer; depositing a third structural layer over the back plate, the third structural layer including an enclosed pillar; depositing a second diaphragm layer over the third structural layer such that the second diaphragm layer includes an upward facing corrugation corresponding to the enclosed pillar in the third structural layer; and releasing the first diaphragm layer and the second diaphragm layer.

In some embodiments, the process further comprises depositing the back plate layer over the second structural layer, the back plate layer including at least one aperture; selectively etching the third structural layer and the second structural layer to form at least one cavity that extends through the at least one aperture; and depositing the second diaphragm layer over the third structural layer such that the second diaphragm includes at least one post corresponding to the at least one cavity, the at least one post being coupled to the first diaphragm layer.

In some embodiments, the process further comprises forming a through hole through the second diaphragm layer and the first diaphragm layer at a portion of the at least one post. In some embodiments, the process further comprises etching at least a portion of the first structural layer and the second structural layer to form at least one internal cavity defined in part by the first diaphragm layer and the second diaphragm layer. In some embodiments, the process further comprises etching at least a portion of the first structural layer and the second structural layer to form a peripheral support structure positioned between the first diaphragm layer and the second diaphragm layer, and wherein the peripheral support structure is positioned along a periphery of the first diaphragm layer. In some embodiments, at least one of the second structural layer and the third structural layer has an impurity content. In some embodiments, at least one of the second structural layer and the third structural layer comprises phosphosilicate glass (PSG) or borophosphosilicate glass (BPSG), and wherein the impurity content comprises phosphorus. In some embodiments, the second structural layer is a first PSG layer having a first phosphorus content, and the third structural layer is a second PSG layer having a second phosphorus content different from the first phosphorus content. In some embodiments, the first phosphorus content is between 2% and 6%, and the second phosphorus content is between 4% and 10%, the second phosphorus content being greater than the first phosphorus content.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A capacitive microelectromechanical systems (MEMS) die, comprising:
   a substrate having a through-hole;
   a diaphragm having an annular corrugation disposed between a substantially planar central portion and an outer portion, the substantially planar central portion having a conductive portion,
   the annular corrugation defined by softened edges or corners at an interface between the annular corrugation and the central and outer portions of the diaphragm;
   a back plate having a conductive portion,
   the back plate and the diaphragm disposed in spaced-apart relation to form a capacitive structure located over the through-hole of, and supported by, the substrate,
   wherein the annular corrugation extends in a direction toward the backplate and is spaced apart from the substrate, wherein the corrugation increases the compliance of the diaphragm.

2. The capacitive MEMS die of claim 1, wherein:
   the softened edges or corners are characterized by a radius of curvature greater than 1 µm and less than 50 µm, and
   the corrugated diaphragm has reduced stress at locations formed by the softened edges or corners.

3. The capacitive MEMS die of claim 1, wherein at least a portion of the annular corrugation is located radially outwardly of the through-hole.

4. The capacitive MEMS die of claim 1, wherein the annular corrugation is located radially outwardly of the through-hole.

5. The capacitive MEMS die of claim 1, wherein the conductive portion of the diaphragm and the conductive portion of the back plate are substantially aligned and positioned over the through-hole.

6. The capacitive MEMS die of claim 1, further comprising a structural layer supporting the diaphragm at a peripheral corner of the diaphragm, wherein the structural layer comprises a different material than the diaphragm.

7. The capacitive MEMS die of claim 6, wherein the diaphragm comprises silicon nitride and the structural layer comprises phosphosilicate glass (PSG) or a borophosphosilicate glass (BPSG).

8. The capacitive MEMS die of claim 6, wherein the structural layer comprises multiples layers having different glass transition temperatures.

9. A capacitive microelectromechanical systems (MEMS) die, comprising:
   a substrate having a through-hole;
   a first electrode having a conductive central portion, a peripheral corner, and an annular corrugation;
   a structural element disposed in the peripheral corner of the first electrode, the structural element comprising a different material than the first electrode;
   a second electrode having a conductive central portion;
   the first electrode and the second electrode disposed in spaced-apart relation to form a capacitive structure located over the through-hole of, and supported by, the substrate,
   wherein the structural element increases robustness of the capacitive MEMS die relative to MEMS die that does not have the structural element, and
   wherein the annular corrugation extends in a direction toward the second electrode and is spaced apart from the substrate, wherein the corrugation increases the compliance of the first electrode.

10. The capacitive MEMS die of claim 9, wherein the peripheral corner is substantially annular.

11. The capacitive MEMS die of claim 9, wherein the first electrode comprises silicon nitride and the structural element comprises phosphosilicate glass (PSG) or a borophosphosilicate glass (BPSG).

12. The capacitive MEMS die of claim 9, wherein the structural element comprises multiples layers having different glass transition temperatures.

13. The capacitive MEMS die of claim 12, wherein the first electrode comprises silicon nitride and the multiple layers comprise a phosphosilicate glass (PSG) or a borophosphosilicate glass (BPSG) having different phosphorus contents.

14. The capacitive MEMS die of claim 9, wherein the annular corrugation has softened edges or corners characterized by a radius of curvature greater than 1 µm and less than 50 µm.

15. The capacitive MEMS die of claim 14, wherein the annular corrugation is located radially outwardly of the through-hole.

* * * * *